US007701208B2

(12) United States Patent
Nishikawa

(10) Patent No.: US 7,701,208 B2
(45) Date of Patent: *Apr. 20, 2010

(54) MAGNETIC SENSOR CIRCUIT AND PORTABLE TERMINAL PROVIDED WITH SUCH MAGNETIC SENSOR CIRCUIT

(75) Inventor: Hidetoshi Nishikawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 272 days.

This patent is subject to a terminal disclaimer.

(21) Appl. No.: 11/815,696

(22) PCT Filed: Feb. 6, 2006

(86) PCT No.: PCT/JP2006/301972

§ 371 (c)(1),
(2), (4) Date: Aug. 7, 2007

(87) PCT Pub. No.: WO2006/085503

PCT Pub. Date: Aug. 17, 2006

(65) Prior Publication Data

US 2008/0265880 A1 Oct. 30, 2008

(30) Foreign Application Priority Data

Feb. 8, 2005 (JP) ............................ 2005-031715
Aug. 9, 2005 (JP) ............................ 2005-230781

(51) Int. Cl.
*G01R 33/07* (2006.01)
*H03K 3/59* (2006.01)
*H03K 17/90* (2006.01)

(52) U.S. Cl. ...................................... 324/251; 327/511

(58) Field of Classification Search ........... 324/207.21, 324/207.2, 251, 252; 327/510, 511; 257/426, 257/427; 338/32 R, 32 H
See application file for complete search history.

(56) References Cited

U.S. PATENT DOCUMENTS 4,835,716 A 5/1989 Tamaki et al.
5,202,675 A 4/1993 Tokimoto et al.
5,790,234 A 8/1998 Matsuyama
5,861,806 A 1/1999 Vories et al.

(Continued)

FOREIGN PATENT DOCUMENTS

JP 63-079386 4/1988

(Continued)

OTHER PUBLICATIONS

Office Action dated Apr. 1, 2009 for U.S. Appl. No. 11/828,199.

*Primary Examiner*—Kenneth J Whittington
(74) *Attorney, Agent, or Firm*—Fish & Richardson P.C.

(57) ABSTRACT

A Hall element outputs a Hall voltage generated at a first terminal pair or a second terminal pair to first and second output terminals by switching the voltage in a first status and a second status. Based on the voltages of the first and the second output terminals and a reference voltage, first and second capacitors are charged. Then, the voltages of the first and the second capacitors are compared, and a detection signal is obtained. Thus, a magnetic sensor circuit which reduces influence of an element offset voltage of the Hall element and also reduces influence of an input offset voltage generated at an amplifier, and a portable terminal provided with such magnetic sensor circuit are provided.

18 Claims, 15 Drawing Sheets

U.S. PATENT DOCUMENTS

| | | | | |
|---|---|---|---|---|
| 6,157,171 | A | 12/2000 | Smith | |
| 6,794,863 | B2 | 9/2004 | Hatanaka | |
| 2004/0130317 | A1 | 7/2004 | Hatanaka | |
| 2006/0148540 | A1 * | 7/2006 | Satoh et al. | 455/575.3 |
| 2006/0277995 | A1 * | 12/2006 | Kutsuna | 73/504.02 |
| 2008/0030191 | A1 * | 2/2008 | Nishikawa | 324/252 |
| 2008/0048772 | A1 * | 2/2008 | Nishikawa | 327/544 |
| 2008/0265880 | A1 | 10/2008 | Nishikawa | |

FOREIGN PATENT DOCUMENTS

| | | |
|---|---|---|
| JP | 03-267781 | 11/1991 |
| JP | 04-271513 | 9/1992 |
| JP | 08-194040 | 7/1996 |
| JP | 08-201491 | 8/1996 |
| JP | 10-170533 | 6/1998 |
| JP | 11-131879 | 5/1999 |
| JP | 2000-030765 | 1/2000 |
| JP | 2001-337147 | 12/2001 |
| JP | 2004-020289 | 1/2004 |
| JP | 2004-037221 | 2/2004 |
| JP | 2004-180286 | 6/2004 |
| WO | 2006/085503 | 8/2006 |

* cited by examiner 1
10
A
B
C
D
20
21
22
23
24
25
26
27
28
SW1
SW2
Vcc
i
ii
Vb,Va
Vd,Vc
30
31
32
34
35
POW
iii
iv
41
42
51
52
53
53-1
53-2
Vref1A
Vref1
Vref2
v
vi
60
61
70
D
Q
C
CK
80
Sdet POW
SW1
SW2
CK
T1
T2
τ
t1
t2
t3
t4
t5

1A
10
A
B
C
D
20
21
22
23
24
25
26
27
28
SW1
SW2
Vcc
i
Vb,Va
ii
Vd,Vc
30
31
32
34
35
POW
AOUT1
AOUT2
iii
iv
41
42
51
52
53
53-1
53-2
Vref1A
Vref1
Vref2
SW3
L1
L2
v
vi
Vcomp1
Vcomp2
60
61
70
71
D
Q
C
CK_SH1
CK_SH2
COMPOUT
DFF_SH1
DFF_SH2
OR1
80
INV0
OUT
Sdet
100
CONTROL CIRCUIT
POW SW1 SW2 SW3

1B
Vref1A
Vref1
53
53-1
53-2
Sdet
30
Vcc
34
POW
31
AOUT1
35
AOUT2
32
10
A
B
C
D
20
21
22
23
24
25
26
27
28
SW1
SW2
i
Vb,Va
ii
Vd,Vc
iii
iv
51
SW3
41
L1
v
Vcomp1
Vcomp2
vi
42
L2
52
Vref2
61
60
70
D Q
C
DFF_SH1
OUT
INV0
CK_SH1
OR1
COMPOUT
71
DFF_SH2
80
CK_SH2
POW SW1 SW2 SW3
SET
CONTROL CIRCUIT
100A 100A
OSCILLATOR
101
OSC
FREQUENCY DIVIDING CIRCUIT
102A
SET
SIG
SHIFT REGISTER
103
Q0
Q1
Q2
Q3
Q4
S0
S1
S2
S3
S4
OR11
OR12
OR13
OR14
FF1
FF2
FF3
FF4
D
C
Q
S11
DELAY CIRCUIT
104
105
106
107
POW
CTL1
CTL2
CTL3
INV1
INV2
CLK_SH1
CLK_SH2

102A
SIG
AND11
OR21
OR22
NOR1
NOR2
NOR2
Q0
Q1
Q2
Q3
COUNTER
111
112
113
OSC
SET 167
165
P+
P
N
162
168
N+
95
10
91A
167 165
165 167
161
N
P 167 165
P+
P
N-
162
168
N+
N
10
164
161
165 167
91A
95

MAGNETIC SENSOR CIRCUIT AND PORTABLE TERMINAL PROVIDED WITH SUCH MAGNETIC SENSOR CIRCUIT

TECHNICAL FIELD

The present invention relates to a magnetic sensor circuit amplifying, by an amplifier, an output voltage of a magnetoelectric converting element such as a Hall element or a magnetoresistance element, detecting magnetism of a place where the element is provided, and outputting a magnetism detection signal, as well as to a portable terminal having such a magnetic sensor circuit.

BACKGROUND ART

A magnetic sensor circuit generally includes a Hall element outputting an output voltage in proportion to magnetic field intensity, an amplifier amplifying the output voltage of the Hall element, and a comparator comparing the output voltage of the amplifier with a prescribed reference voltage and outputting a result of comparison. Further, the magnetic sensor circuit is adopted to output a binary (high (H) level or low (L) level) signal dependent on whether the magnetic field of the place where the magnetic sensor is arranged is higher or lower than a prescribed reference.

In order to obtain an accurate result of comparison based on the magnetic field intensity, it is necessary to reduce offset signal components involved in the signal output from the amplifier and to curb variation in signals output from the amplifier. Main factors causing the offset signal component include an offset signal component involved in the output voltage of the Hall element (hereinafter referred to as an “element offset voltage”) and an offset signal component existing at an input terminal of the amplifier (hereinafter referred to as an “input offset voltage”). The element offset voltage is mainly generated, for example, by a stress from a package to the body of Hall element. Further, the input offset voltage is mainly generated by variation in characteristics of elements forming an input circuit of the amplifier.

Japanese Patent No. 3315397 (Patent Document 1) discloses a magnetic field sensor that reduces the influence of such offset voltages. Specifically, a Hall element used in a magnetic field sensor is generally formed as a plate of geometrically equivalent shape with respect to four terminals A, B, C and D, as represented by a Hall element 1 shown in FIG. 17. Here, a geometrically equivalent shape means that the shape in the state shown in the figure is the same as the shape when the element is rotated by 90 degrees (rotated so that A-C matches B-D), as in the case of Hall element 1 of square shape shown in the figure. A voltage generated across terminals B-D when a power supply voltage is applied across terminals A-C and the voltage generated across terminals A-C when a power supply voltage is applied across terminals B-D of Hall element 1 as such have effective signal components reflecting the magnetic field intensity of the same phase, and element offset voltages of opposite phases.

At a first timing, a power supply voltage is applied across terminals A-C of Hall element 1 through a switch circuit 2, and the voltage across terminals B-D is input to a voltage amplifier 3. Then, a voltage V1 that is in proportion to a sum of the voltage across terminals B-D and the input offset voltage of voltage amplifier 3 is output from voltage amplifier 3. Further, at this first timing, a switch 5 is closed, so that a capacitor 4 is charged to the voltage V1.

Next, at a second timing, the power supply voltage is applied across terminals B-D of Hall element 1 through switch circuit 2, and the voltage across terminals C-A is input to voltage amplifier 3 to establish polarity opposite to that at the first timing. Then, a voltage V2 that is in proportion to a sum of the voltage across terminals C-A and the input offset voltage of voltage amplifier 3 is output from voltage amplifier 3.

The influence of input offset voltage is the same as at the first timing regardless of the polarity of input voltage, and therefore, output voltage V2 of voltage amplifier 3 comes to be a voltage that is in proportion to the sum of the voltage across terminals C-A having the polarity opposite to that at the first timing and the input offset voltage.

Further, at the second timing, switch 5 is opened, and between output terminals 6 and 7, an inverting output terminal 3*a* and a non-inverting output terminal 3*b* of voltage amplifier 3 and a capacitor 4 come to be connected in series. At this time, charging voltage of capacitor 4 is kept unchanged from the output voltage V1 of voltage amplifier 3 at the first timing. A voltage V across output terminals 6-7 (output voltage of magnetic field sensor) is a sum of voltage V2 at non-inverting output terminal 3*b* with inverting output terminal 3*a* of voltage amplifier 3 being a reference and a voltage −V1 at a terminal 4*a* with a terminal 4*b* of capacitor 4 being a reference, that is, a voltage obtained by subtracting voltage V1 from voltage V2. Therefore, the voltage V that cancels the influence of input offset voltage Voff is obtained as the output voltage of magnetic field sensor.

Further, as a magnetic field sensor that reduces the influence of element offset voltage and that can also reduce the influence of input offset voltage generated in the amplifier, a sensor disclosed in Japanese Patent Laying-Open No. 08-201491 (Patent Document 2) has been known. The magnetic field sensor includes a Hall element, a switch circuit, a voltage/current converter-amplifier, a capacitor as a storage element, a switch and a resistor.

Patent Document 1: Japanese Patent No. 3315397

Patent Document 2: Japanese Patent Laying-Open No. 08-201491

DISCLOSURE OF THE INVENTION

Problems to be Solved by the Invention

In the magnetic field sensor according to Japanese Patent No. 3315397 (Patent Document 1), it is expected in an ideal state that the offset can satisfactorily be cancelled. Actually, however, the magnetic field sensor formed by capacitor 4 and voltage amplifier 3 is not a circuit of fully differential type. Therefore, offset cancellation would possibly be insufficient because of a delay (lag) caused by capacitor 4 or ripples or noise in the power supply voltage.

Further, the magnetic field sensor according to Japanese Patent Laying-Open No. 08-201491 (Patent Document 2) requires two voltage/current converter-amplifiers, two capacitors and four switches and, therefore, it is difficult to have the circuit scale kept small in order to reduce the influence of the input offset voltage.

Therefore, an object of the present invention is to provide a magnetic sensor circuit having a differential type circuit configuration for detecting magnetism, that can reduce the influence of element offset voltage derived from magnetoelectric converting element such as a Hall element or a magnetoresistance element and that can also reduce the influence of input offset voltage generated in an amplifier, as well as to provide a portable terminal having such a magnetic sensor circuit.

A further object of the present invention is to provide a magnetic sensor circuit that can reduce the influence of element offset voltage and input offset voltage by a relatively simple circuit structure, as well as to provide a portable terminal having such a magnetic sensor circuit.

Means for Solving the Problems

In summary, the present invention provides a magnetic sensor circuit, including: a magnetoelectric converting element, a switch selecting circuit, an amplifying unit, a comparing unit, first and second capacitors, and first and second switch circuits. The magnetoelectric converting element generates an output voltage across a first terminal pair or a second terminal pair in accordance with applied magnetism. The switch selecting circuit has a first switch status in which a power supply voltage is applied to the first terminal pair and an output voltage generated at the second terminal pair is output across a first output end and a second output end and a second switch status in which the power supply voltage is applied to the second terminal pair and an output voltage generated at the first terminal pair is output across the first output end and the second output end. The amplifying unit outputs to a first amplification output end a first amplified voltage obtained by amplifying the voltage of the first output end input to a first amplification input end, and outputting to a second amplification output end a second amplified voltage obtained by amplifying the voltage of the second output end input to a second amplification end. The comparing unit compares a first comparison voltage input to a first comparison input end with a second comparison voltage input to a second comparison input end and generates a comparison output when the first comparison voltage is different from the second comparison voltage. The first capacitor is provided between the first amplification output end and the first comparison input end. The second capacitor is provided between the second amplification output end and the second comparison input end. The first switch circuit applies a first reference voltage to the first comparison input end. The second switch circuit applies a second reference voltage to the second comparison input end.

Preferably, the first reference voltage is applied to the first comparison input end in the first switch status. The second reference voltage is applied to the second comparison input end in the first switch status.

Preferably, the second reference voltage is different from the first reference voltage.

Preferably, the amplifying unit includes a first operating amplifier, a first feedback resistor, a second operating amplifier, a second feedback resistor, and a third feedback resistor. The first operating amplifier receives a voltage of the first output end at a non-inverting end and outputs the first amplified output from an output end. The first feedback resistor is provided between the output end and an inverting input end of the first operating amplifier. The second operating amplifier receives a voltage of the second output end at a non-inverting input end and outputs the second amplified output from an output end. The second feedback resistor is provided between the output end and an inverting input end of the second operating amplifier. The third feedback resistor is provided between the inverting input end of the first operating amplifier and the inverting input end of the second operating amplifier.

Preferably, the magnetic sensor circuit further includes a latch circuit latching the comparison output from the comparing unit in response to a clock signal and outputting a latch output. The clock signal is generated at a timing of the second switch status.

More preferably, the magnetic sensor circuit further includes a reference voltage switch circuit. The reference voltage switch circuit converts a voltage applied to the first comparison input end from the first reference voltage either to a first modified reference voltage different from the first reference voltage or to the second reference voltage, in response to the latch output.

Preferably, at least one of the amplifying unit and the comparing unit operates intermittently as the power supply voltage is applied at every first interval for a prescribed time period.

More preferably, a period of the first switch status is provided in a former half and a period of the second switch status is provided in a latter half, of the prescribed time period.

More preferably, the magnetic sensor circuit further includes a latch circuit latching the comparison output from the comparing unit in response to a clock signal and outputting a latch output. The clock signal is generated at a timing of the second switch status.

More preferably, the magnetic sensor circuit further includes a reference voltage switch circuit. The reference voltage switch circuit converts a voltage applied to the first comparison input end from the first reference voltage either to a first modified reference voltage different from the first reference voltage or to the second reference voltage, in response to the latch output.

Preferably, the magnetic sensor circuit further includes first, second and third resistors. The first resistor is connected between a first reference voltage end outputting the first reference voltage and a second reference voltage end outputting the second reference voltage. The second resistor has one end connected to the first reference voltage end and the other end connectable to a ground potential. The third resistor has one end connected to the second reference voltage end and the other end connectable to the power supply voltage. The resistance value of the first resistor is smaller than a sum of resistance value of the second resistor and resistance value of the third resistor. An amount of change with temperature of the resistance value of the first resistor is smaller than an amount of change with temperature of electric resistance value of the magnetoelectric converting element. The temperature characteristic of the resistance value of the second resistor and temperature characteristic of the resistance value of the third resistor are both the same as temperature characteristic of the electric resistance value of the magnetoelectric converting element.

More preferably, the magnetoelectric converting element, the second resistor and the third resistor are elements formed of a material of the same type in one same semiconductor substrate.

Preferably, the magnetic sensor circuit further includes a control circuit. The control circuit causes at least one of the amplifying unit and the comparing unit to operate intermittently by controlling the power supply voltage to be supplied at every first interval for a prescribed time period. The control circuit sets the switch selecting circuit to the first switch status, the second switch status, the second switch status and the first status, respectively, in first to fourth periods included in the prescribed time period. The control circuit controls the first switch circuit so that the first reference voltage is applied to the first comparison input end, and controls the second switch circuit so that the second reference voltage is applied to the second comparison input end, in the first and third periods.

More preferably, the magnetic sensor circuit further includes a first latch circuit, an OR circuit and a second latch circuit. The first latch circuit latches the comparison output from the comparing unit in response to a first clock signal and outputs a first latch output. The OR circuit receives the comparison output and the first latch output. The second latch circuit latches an output from the OR circuit in response to a second clock signal and outputs a second latch output. The control circuit outputs the first clock signal in the second period, and outputs the second clock signal in the fourth period.

More preferably, the magnetic sensor circuit further includes a reference voltage switch circuit. The reference voltage switch circuit converts a voltage applied to the first comparison input end from the first reference voltage either to a first modified reference voltage different from the first reference voltage or to the second reference voltage, in response to the second latch output.

More preferably, the control circuit sets the switch selecting circuit such that the second switch status starts after a prescribed time period from the end of the first switch status in the second period, and sets the switch selecting circuit such that the first switch status starts after the prescribed time period from the end of the second switch status in the fourth period.

More preferably, the control circuit changes length of the first period based on an input set signal.

According to another aspect, the present invention provides a portable terminal, including a battery power source and a magnetic sensor circuit to which a power supply voltage of the battery power source is supplied as an operational voltage. The magnetic sensor circuit includes a magnetoelectric converting element, a switch selecting circuit, an amplifying unit, a comparing unit, first and second capacitors, and first and second switch circuits. The magnetoelectric converting element generates an output voltage across a first terminal pair or a second terminal pair in accordance with applied magnetism. The switch selecting circuit has a first switch status in which a power supply voltage is applied to the first terminal pair and an output voltage generated at the second terminal pair is output across a first output end and a second output end, and a second switch status in which the power supply voltage is applied to the second terminal pair and an output voltage generated at the first terminal pair is output across the first output end and the second output end. The amplifying unit outputs to a first amplification output end a first amplified voltage obtained by amplifying the voltage of the first output end input to a first amplification input end, and outputs to a second amplification output end a second amplified voltage obtained by amplifying the voltage of the second output end input to a second amplification end. The comparing unit compares a first comparison voltage input to a first comparison input end with a second comparison voltage input to a second comparison input end and generates a comparison output when the first comparison voltage is different from the second comparison voltage. The first capacitor is provided between the first amplification output end and the first comparison input end. The second capacitor is provided between the second amplification output end and the second comparison input end. The first switch circuit applies a first reference voltage to the first comparison input end. The second switch circuit applies a second reference voltage to the second comparison input end.

EFFECTS OF THE INVENTION

According to the present invention, the amplifying unit is operated in a differential manner, whereby the element offset voltage of the magnetoelectric converting element such as the Hall element and the magnetoresistance element as well as the input offset voltage of the amplifying unit can sufficiently be reduced.

Further, according to the present invention, the first and second capacitors are charged to attain a prescribed status in the first switching status, so that the input voltage reference value of the comparing unit is set to a prescribed value. Consequently, it becomes possible to set a wide input dynamic range.

Further, according to the present invention, the amplifying unit is formed as a balanced input-balanced output type circuit using a unique configuration, and hence, large gain in voltage amplification can be attained. This makes it unnecessary to prepare a reference voltage in the amplifying unit and, as a result, adjustment of the reference voltage to the output voltage of the magnetoelectric converting element becomes unnecessary. Further, the number of feedback resistors can be decreased.

Further, power supply voltage is intermittently supplied to main units (such as the amplifying unit and the comparing unit), and the intermittent operation is combined with a latch operation based on a comparison output, whereby power consumption can be reduced while stable detection of magnetism is realized.

Further, first and second reference voltages to the comparing unit are made different, and by changing the reference voltage (from the first reference voltage to the modified first reference voltage, or the second reference voltage) in response to a latch operation based on the comparison output, it becomes possible to have the comparing unit with hysteresis characteristic. The maximum hysteresis error can be set by simply setting the first or the modified first reference voltage (or the second reference voltage), and hence, it can be designed and adjusted in a simple manner.

DESCRIPTION OF THE REFERENCE SIGNS

10 Hall element, 20 switch selecting circuit, 21~28 switches, 30, 30A, 30B amplifying units, 31, 31A, 31B first amplifying circuits, 32, 32A, 32B second amplifying circuits, 34, 35 switch circuits, 41, 42 first and second capacitors, 51, 52 first and second switch circuits, 53 reference voltage switching circuit, 60 comparing unit, 61 switch circuit, 70, 71 latch circuits, 80, 80A buffer amplifiers, 90, 90A reference voltage generating circuits, Vcc power supply voltage, POW power-on signal, SW1 first switch signal, SW2 second switch signal, Vref1 first reference voltage, Vref1A modified first reference voltage, Vref2 second reference voltage, Sdet detection signal, 1, 1A, 1B magnetic sensor circuits, 41A, 41B, 42A, 42B capacitors, 91~95, 91A, 93A voltage dividing resistors, 96 P-type MOS transistor, 97 N-type MOS transistor, 100, 100A control circuits, 101 oscillator, 102, 102A frequency dividing circuits, 104~107 delay circuits, 111~113 counters, 105 portable telephone, 151 body, 152 housing, 154 battery, 155 magnet, 156 display, AND1, AND11 AND circuits, FF1~FF4 D-type flip-flops, INV0~INV2, INV11~INV1*n* inverters, L1, L2 signal lines, N1, N2 reference voltage ends, NOR1~NOR3 NOR circuits, OR1, OR11~OR14, OR21, OR 220R circuits, Q0~Q4 terminals.

BEST MODES FOR CARRYING OUT THE INVENTION

In the following, embodiments of the magnetic sensor circuit in accordance with the present invention will be described with reference to the figures. The magnetic sensor circuit in accordance with the present invention is used for wide applications as a sensor for detecting magnetic field status (magnetic field intensity), such as a sensor for detecting opening/closing of a folding type portable telephone or a sensor for detecting rotational position of a motor. As a magnetic sensor element used for the magnetic sensor circuit, any element that has its electrical characteristics changed in accordance with a change in applied magnetic field and that allows extraction of an output voltage reflecting the change may be available, and a Hall element, a magnetoresistance element or the like may be used. In the following, a magnetic sensor circuit using a Hall element will be described.

First Embodiment

Figure 1:
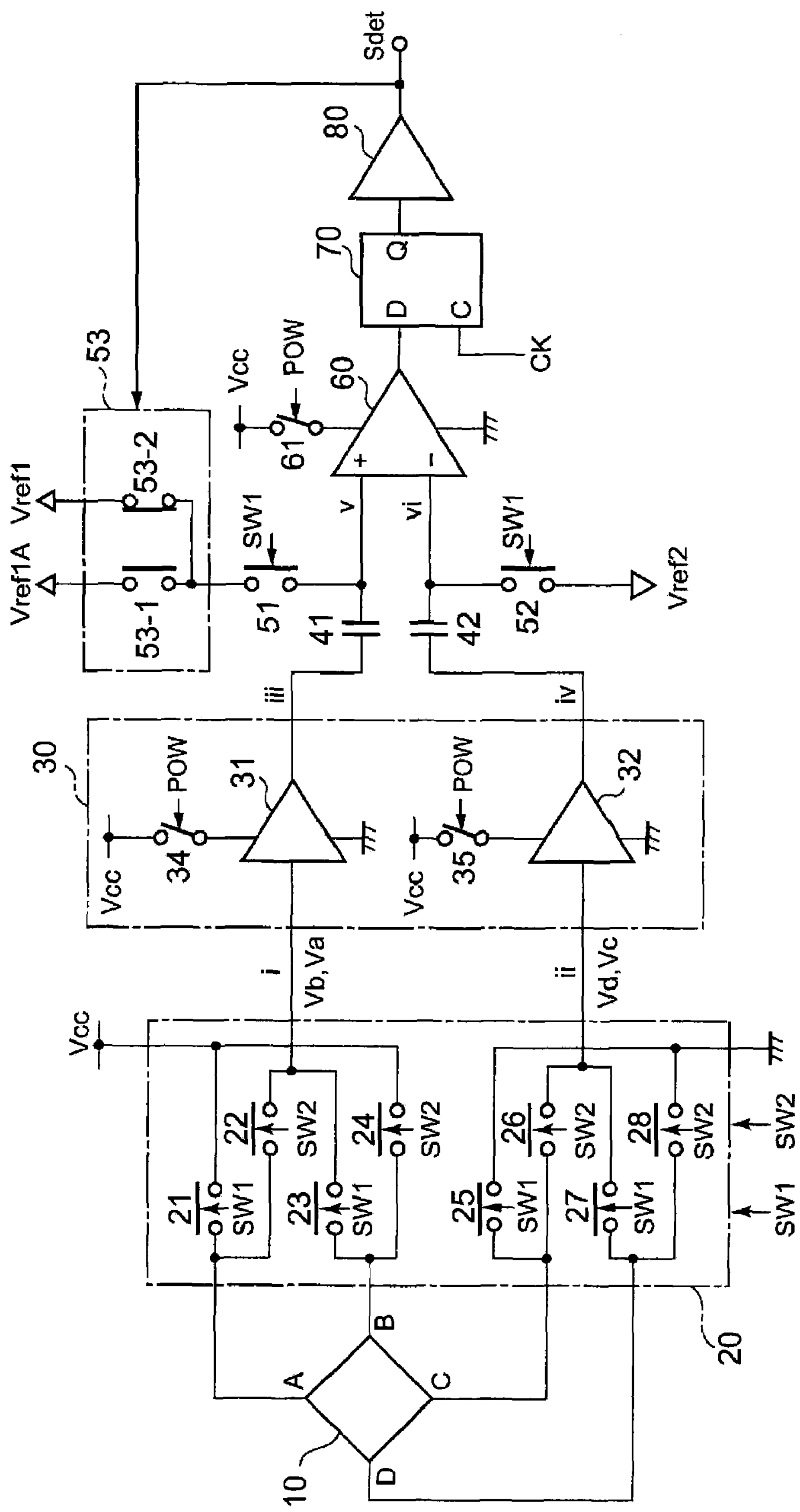
FIG. 1 shows a configuration of a magnetic sensor circuit in accordance with a first embodiment of the present invention.
Figure 17:
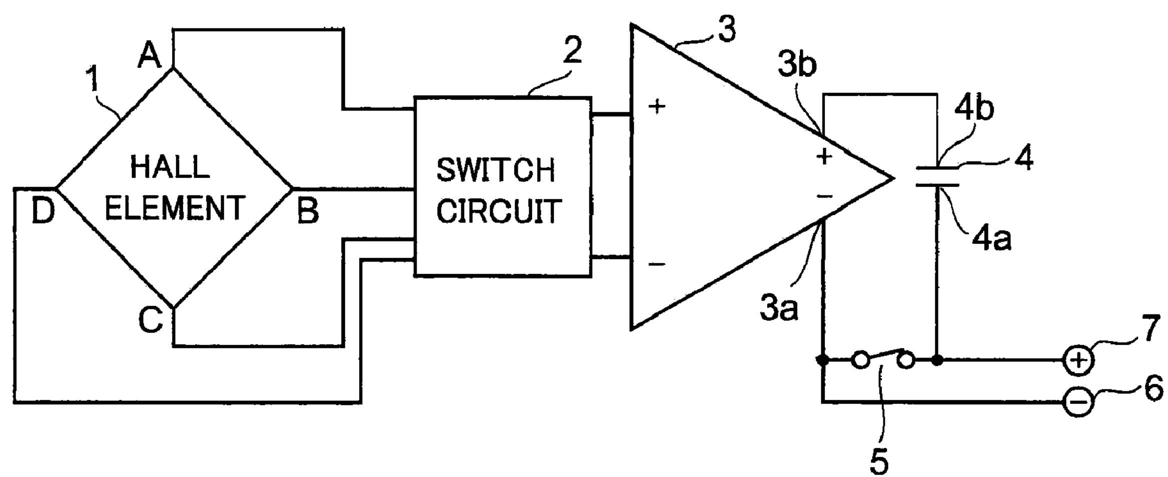
FIG. 17 shows a configuration of a conventional magnetic field sensor.

FIG. 1 shows a configuration of a magnetic sensor circuit in accordance with a first embodiment of the present invention. In FIG. 1, a Hall element 10 included in a magnetic sensor circuit 1 is formed as a plate of a geometrically equivalent shape with respect to four terminals A, C, B and D, similar to the conventional example shown in FIG. 17.

A Hall voltage generated across a second terminal pair B-D when a power supply voltage is applied across a first terminal pair A-C and the Hall voltage generated across the first terminal pair C-A when a power supply voltage is applied across the second terminal pair B-D of Hall element 10 as such have effective signal components, which reflect the intensity of magnetic field applied to the Hall element, of the same phase, and element offset components (element offset voltages) of opposite phases.

A switch selecting circuit 20 switches the manner of applying the power supply voltage Vcc to Hall element 10 and the manner of taking out the Hall voltage from Hall element 10.

Switch selecting circuit 20 includes switches 21, 23, 25 and 27 that turn on in response to a first switch signal SW1 and switches 22, 24, 26 and 28 that turn on in response to a second switch signal SW2. The first and second switch signals SW1 and SW2 are generated not to overlap with each other. Further, the first switch signal SW1 is generated in a former half and the second switch signal SW2 is generated in a latter half, of a prescribed period in which a power-on signal POW is generated. The power-on signal POW is generated intermittently, for example, generated at every prescribed interval for a prescribed time period.

In a first switch status in which the first switch signal SW1 is being generated, power supply voltage Vccs is applied to terminal A, terminal C is grounded, and a Hall voltage in accordance with the magnetic field intensity generates across terminals B and D. The voltage across terminals B-D depends on the direction of applied magnetic field. Here, it is assumed that the voltage Vb at terminal B is low and the voltage at terminal D is high. Here, the voltage represents a potential relative to the ground, unless specified otherwise.

Switching from the first switch signal SW1 to the second switch signal SW2 takes place at a high speed. Therefore, it is assumed that also in the second switch status, the direction of magnetic field is the same as that in the first switch status. In the second switch status in which the second switch signal SW2 is being generated, power supply voltage Vccs is applied to terminal B, terminal D is grounded, and a Hall voltage in accordance with the magnetic field intensity generates across terminals C and A. As to the voltage across terminals C-A, the voltage Vc at terminal C is low and the voltage Va at terminal A is high.

Accordingly, the voltage at a first output terminal i of switch selecting circuit 20 is the voltage Vb in the first switch status, and it is Va in the second switch status. On the other hand, the voltage at a second output terminal ii of switch selecting circuit 20 is the voltage Vd in the first switch status and it is Vc in the second switch status.

An amplifying unit 30 amplifies the voltage at a first amplification input end connected to the first output end i by a first amplifying circuit 31 with a prescribed amplification degree α, and generates a first amplified voltage at a first amplification output end iii. Since there is an input offset voltage Voffa1 in the first amplifying circuit 31, the input offset voltage Voffa1 is added to the voltage at the first amplification input end.

Further, amplifying unit 30 amplifies the voltage at a second amplification input end connected to the second output end ii by a second amplifying circuit 32 with a prescribed amplification degree α, and generates a second amplified voltage at a second amplification output end iv. Since there is an input offset voltage Voffa2 also in the second amplifying circuit 32, the input offset voltage Voffa2 is added to the voltage at the second amplification input end.

To the first and second amplifying circuits 31 and 32 of amplifying unit 30, the power supply voltage is applied through switch circuits 34 and 35 that are turned on by the power-on signal POW. Therefore, amplifying unit 30 operates intermittently in response to the power-on signal POW, for example, at every prescribed interval for a prescribed time period. When the first and second amplifying circuit 31 and 32 are of current-driven type circuits, it is preferred that switch circuits 34 and 35 be formed by current source circuits with a switching function.

A first capacitor 41 is connected between the first amplification output end iii and a first comparison input end v of a comparing unit 60. Further, a second capacitor 42 is connected between a second amplification output end iv and a second comparison input end vi of comparing unit 60.

Comparing unit 60 compares a first comparison voltage input to the first comparison input end v with a second comparison voltage input to the second comparison input end vi, and generates a comparison output when the first comparison voltage exceeds the second comparison voltage. It is noted that comparing unit 60 is formed to have very high impedance. By way of example, the input circuit of comparing unit 60 is formed by an MOS (Metal Oxide Semiconductor) transistor circuit. To comparing unit 60, the power supply voltage is applied through a switch circuit 61 that is turned on in response to the power-on signal POW. Therefore, comparing unit 60 operates intermittently in response to the power-on signal POW, for example, at every prescribed interval for a prescribed time period. Further, switch circuit 61 may be a current source circuit with a switching function.

To the first comparison input end v of comparing unit 60, a first reference voltage Vref1 is supplied through a first switch circuit 51 that turns on by the first switch signal SW1 and through a reference voltage switch circuit 53. When magnetic sensor circuit 1 detects magnetism, reference voltage switch circuit 53 is switched by a detection signal Sdet. When reference voltage switch circuit 53 is switched, a modified first reference voltage Vref1A is supplied to the first comparison input end v.

To the second comparison input end vi, a second reference voltage Vref2 is supplied through a second switch circuit 52 that turns on by the first switch signal SW1. Preferably, the first reference voltage Vref1 is set to a value lower than a prescribed value than the modified first reference voltage Vref1A and the modified first reference voltage Vref1A is set to a value lower than a prescribed value than the second reference voltage Vref2. It is also possible to use the second reference voltage Vref2 as the modified first reference voltage Vref1A.

When a comparison output is not generated, the first and the second reference voltages are used as the voltages supplied to the first and second comparison input ends v and vi, and when a comparison output is generated; the modified first reference voltage and the second voltage are used, whereby it becomes possible to add hysteresis characteristic to the operation of comparing unit 60. This enables stable detection. Hysteresis width can readily be changed by adjusting levels of the first reference voltage, the modified first reference voltage and the second reference voltage.

A latch circuit 70 latches the comparison output at a timing of a clock signal CK. A D-type flip-flop may suitably be used as latch circuit 70. The latch output of latch circuit 70 is amplified by a buffer amplifier 80, and the detection signal Sdet is obtained.

Figure 2:
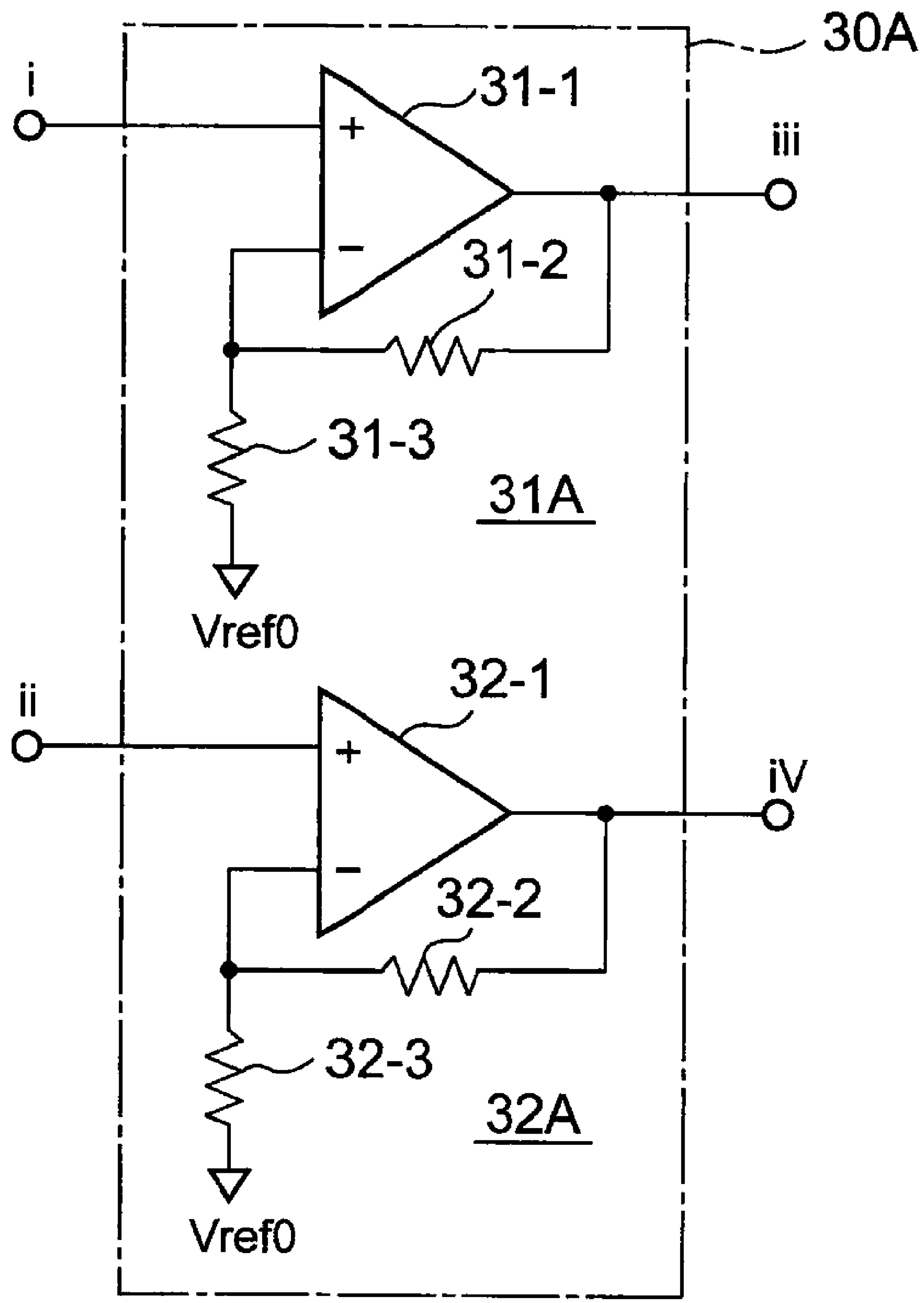
FIG. 2 shows a first example of the amplifying unit.

FIG. 2 shows a first example of the amplifying unit. An amplifying unit 30A of FIG. 2 has first and second amplifying circuits 31A and 32A. In the first amplifying circuit 31A, between an inverting input end of an operating amplifier 31-1 and an output end iii, a feedback resistor 31-2 is connected, and between the inverting input end and a reference voltage Vref, a feedback resistor 31-3 is connected. A voltage at the first output end i input to a non-inverting input end is amplified, and a first amplified voltage is output to a first amplified output end 111. The second amplifying circuit 32A has the same configuration as the first amplification circuit 31A. The second amplifying circuit 32A amplifies a voltage at a second output end ii input to a non-inverting input end, and outputs a second amplified voltage at a second amplified output end iv.

In amplifying unit 30A of FIG. 2, amplification degree $\alpha$ is about R2/R1, where R2 represents resistance value of feedback resistors 31-2 and 32-2 and R1 represents resistance value of feedback resistors 31-3 and 32-3, and R2>>R1.

Figure 3:
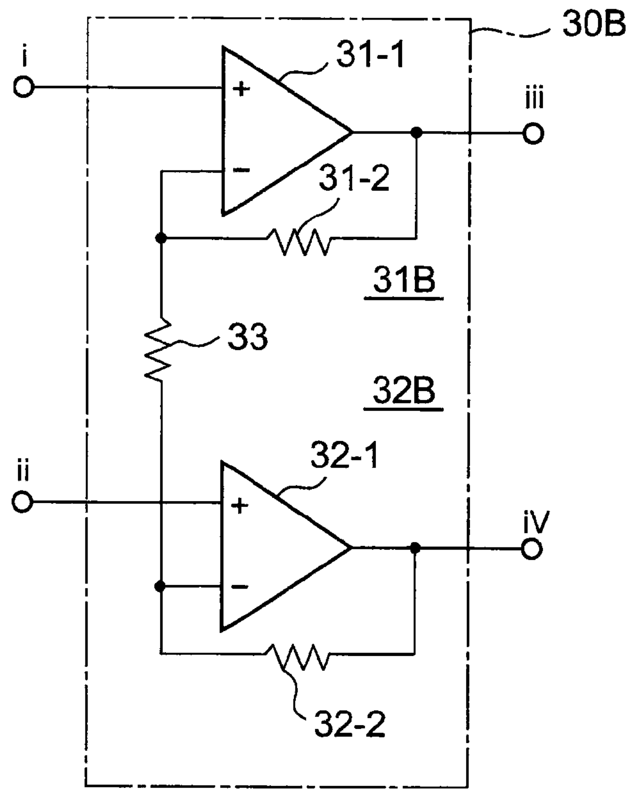
FIG. 3 shows a second example of the amplifying unit.

FIG. 3 shows a second example of the amplifying unit. An amplifying unit 30B of FIG. 3 has: a first operating amplifier 31-1 receiving a voltage of a first output end i at a non-inverting input end and outputting a first amplified output from an output end iii; a first feedback resistor 31-2 provided between an inverting input end and the output end 111 of the first operating amplifier 31-1; a second operating amplifier 32-1 receiving a voltage from a second output end ii at a non-inverting input end and outputting a second amplified output from an output end iv; a second feedback resistor 32-2 provided between an inverting input end and the output end iv of the second operating amplifier 32-1; and a third feedback resistor 33 provided between the inverting input end of the first operating amplifier 31-1 and the inverting input end of the second operating amplifier 32-1.

As described above, amplifying unit 30B is a balanced input-balanced output type amplifying circuit in which the first and second amplifying circuits 31B and 32B share the third feedback resistor 33. In amplifying unit 30B, the number of feedback resistors can be made smaller than in amplifying unit 30A shown in FIG. 2. Further, reference voltages of the first and second amplifying circuits 31A and 31B are set automatically in the circuits. Therefore, setting of the reference voltages becomes unnecessary.

In amplifying unit 30B, a large voltage amplification gain can be attained, as the balanced input-balanced output type circuitry of a unique configuration is used. Specifically, the amplification degree $\alpha$ is about 2×R2/R1 (where R2>>R1), where R2 represents resistance value of feedback resistors 31-2 and 32-2, and R1 represents resistance value of the third feedback resistor 33. As the amplification degree doubles, circuit design becomes easier. Further, it becomes easier to handle a Hall element of lower sensitivity. It is noted that operational power supply voltage of amplifying units 30A and 30B is supplied to respective amplifying circuits through switch circuits 34 and 35, as shown in FIG. 1.

Figure 4:
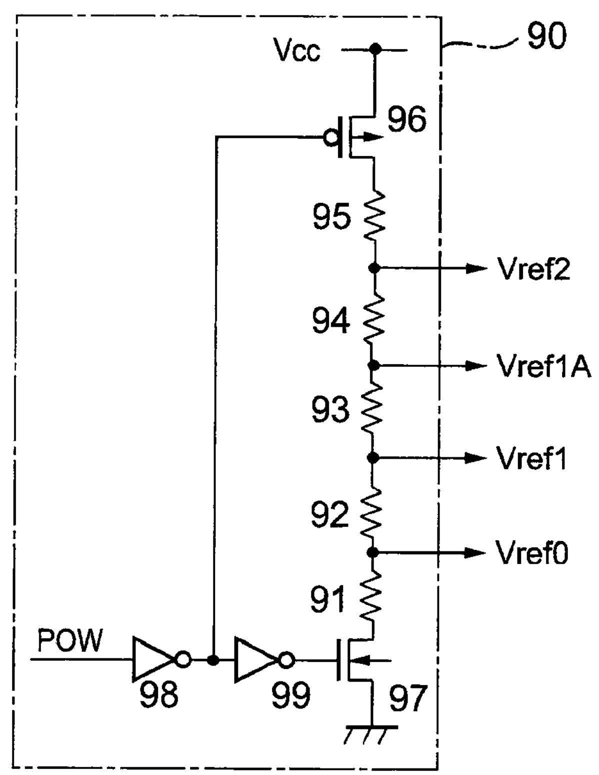
FIG. 4 shows a configuration of a reference voltage generating circuit 90.

FIG. 4 shows a configuration of a reference voltage generating circuit 90. In reference voltage generating circuit 90 of FIG. 4, power supply voltage Vcc is divided by voltage dividing resistors 91~95, to generate a reference voltage Vref0, the first reference voltage Vref1, the modified first reference voltage Vref1A, and the second reference voltage Vref2. These reference voltages are generated when a P-type MOS transistor 96 on the side of power supply voltage Vcc and an N-type MOS transistor 97 on the side of the ground of voltage dividing resistors 91~95 are on. MOS transistors 96 and 97 turn on in response to the power-on signal POW, through inverters 98 and 99. In place of the power-on signal POW, MOS transistors 96 and 97 may be turned on in response to the first switch signal SW1.

Next, an operation of magnetic sensor circuit 1 of the present invention configured as above will be described with reference to a timing chart of FIG. 5. It is noted that power-on signal POW, first switch signal SW1, second switch signal SW2 and clock signal CK are generated from a control circuit, not shown in FIG. 1.

First, power-on signal POW is generated at every first interval T1 only for a prescribed time period T2. Consequently, magnetic sensor circuit 1 operates with power supply voltage Vcc supplied intermittently. By way of example, in order to detect opening/closing of a folding type portable telephone, the first interval T1 may be set to 50 ms, and the prescribed time period T2 may be set to 25 μs. This significantly reduces power consumption of a battery in the portable telephone, while there is no problem in the operation of detecting opening/closing status. The length of the first interval T1 and the prescribed time period T2 may preferably be set to appropriate length, in consideration of usage to which the magnetic sensor circuit of the present invention is applied. It is naturally possible to operate magnetic sensor circuit 1 not intermittently but continuously.

Almost simultaneously with the time point t1 when the power-on signal POW is applied, the first switch signal SW1 is generated. As the first switching signal SW1 is generated, switches 21, 23, 25 and 27 are turned on and switch selecting circuit 20 is set to the first switch status, and the first and second switch circuits 51 and 52 are turned on.

The power supply voltage and the ground voltage are applied to terminals A-C of the first terminal pair of Hall element 10, and a Hall voltage generates across terminals B-D as the second terminal pair. At terminal B, voltage Vb generates, and at terminal D, voltage Vd generates.

At the first amplification output end iii of amplifying unit 30, a first amplified voltage α (Vb−Voffa1), which is the amplified voltage Vb, generates. At the second amplification output end iv, a second amplified voltage α (Vd−Voffa1), which is the amplified voltage Vd, generates. The value a represents amplification degree of amplifying unit 30, and Voffa1 represents an input offset voltage of the first amplifying circuit 31.

In this first switch status, the first and second switch circuits 51 and 52 are on. Further, assuming that reference voltage switch circuit 53 is not switched, switch 53-2 is on. Therefore, to the first comparison input v of comparing unit 60, the first reference voltage Vref1 is being applied. To the second comparison input end vi, the second reference voltage Vref2 is being applied.

Thus, the first capacitor 41 is charged such that a difference voltage at opposite ends thereof attains to Vref1−α(Vd−Voffa1). The second capacitor 42 is charged such that a difference voltage at opposite ends thereof attains to Vref2−α (Vd−Voffa1).

At time point t2, the first switch signal SW1 is lost and the first switch status ends. At a time point t3 delayed by a prescribed short period τ from time point t2, the second switch signal SW2 is generated. By the provision of the prescribed short period τ, a period is set which is neither the first switch status nor the second switch status, of switch selecting circuit 20. By the generation of second switch signal SW2, switches 22, 24, 26 and 28 are turned on and switch selecting circuit 20 is set to the second switch status, and the first and second switch circuits 51 and 52 are turned off.

To terminals B and D of the second terminal pair of Hall element 10, the power supply voltage and the ground voltage are applied, and a Hall voltage generates across terminals C-A as the second terminal pair. The voltage Vc generates at terminal C, and the voltage Va generates at terminal A.

At the first amplification output end iii of amplification unit 30, the first amplified voltage α(Va−Voffa1), which is the amplified voltage Va, generates. At the second amplified output end iv, the second amplified voltage α(Vc−Voffa1), which is the amplified voltage Vc, generates.

In this second switch status, the first and second switch circuits 51 and 52 are off. Reference voltage switch circuit 53 has not yet been switched, and therefore, switch 53-2 is on.

Electric charges stored in the first and second capacitors 41 and 42 are held unchanged, and therefore, a first comparison voltage Vcomp1 of the first comparison input end v and a second comparison voltage Vcomp2 of the second comparison input end vi of comparing unit 60 are given by Equations 1 and 2 below.

$$Vcomp1=Vref1-[\alpha(Vb-Voffa1)-\alpha(Va-Voffa1)]=Vref1-\alpha(Vb-Va) \quad (1)$$

$$Vcomp2=Vref2-[\alpha(Vd-Voffa2)-\alpha(Vc-Voffa2)]=Vref2-\alpha(Vd-Vc) \quad (2)$$

As can be seen from Equations 1 and 2, the first and second comparison voltages Vcomp1 and Vcomp2 do not contain offset voltages Voffa1 and Voffa2. Specifically, the input offset voltages Voffa1 and Voffa2 are cancelled by the switching between the first and second switch statuses.

Then, by comparing unit 60, the first and second comparison voltages Vcomp1 and Vcomp2 are compared. Specifically, a difference between the first and second comparison voltages Vcomp1 and Vcomp2 is obtained, and when the first comparison voltage Vcomp1 exceeds the second comparison voltage Vcomp2 (Vcomp1>Vcomp2), that is, when the first and second comparison voltages Vcomp1 and Vcomp2 are different, a comparison output is generated. The comparison at comparing unit 60 is represented by Equation 3.

$$Vcomp1-Vcomp2=Vref1-Vref2-\alpha(Vb-Va)+\alpha(Vd-Vc) \quad (3)$$

Now, the Hall voltage generated at Hall element 10 involves a signal component voltage in proportion to the magnetic field strength and the element offset voltage. In Hall element 10 in accordance with the present invention, the voltage generated across terminals B-D in the first switch status and the voltage generated across terminal C-A in the second switch status have the effective signal components of the same phase and the element offset voltages of opposite phases.

Let us represent element offset voltages involved in voltages Vb, Vd, Va and Vc by Vboffe, Vdoffe, Vaoffe and Vcoffe, respectively. Then, from the equation representing 90° cancellation of the Hall element, it holds: Vboffe−Vdoffe=Vaoffe−Vcoffe. By modifying this equation, Equation 4 below results.

$$Vboffe-Vaoffe=Vdoffe-Vcoffe \quad (4)$$

Equation 4 represents that in comparing the first and second comparison voltages Vcomp1 and Vcomp2 in accordance with Equation 3, the element offset voltages are cancelled.

As described above, the element offset voltage of Hall element 10 and the input offset voltage of amplifying unit 30 are both cancelled in the comparing operation of comparing unit 60.

Next, at time t4, clock signal CK rises. At the rise of clock signal CK, latch circuit 70 latches the comparison output from comparing unit 60. When the comparison output is latched, detection signal Sdet is generated from buffer amplifier 80. At time t5, power-on signal POW is lost, and approximately at the same time the second switch signal SW2 is lost. Here, the second switch signal SW2 is formed by inverting and delaying the clock signal CK.

In the second switch status, if the first comparison voltage Vcomp1 is smaller than the second comparison voltage Vcomp2, the comparison output is not generated (that is, L level), and therefore, the detection signal Sdet is not generated. On the other hand, if the first comparison voltage Vcomp1 exceeds the second comparison voltage Vcomp2, the comparison output is generated (that is, H level), and hence, the detection signal Sdet is generated.

By the generation of detection signal Sdet, reference voltage switch circuit 53 is switched, switch 53-2 is turned off, and switch 53-1 is turned on. Consequently, to the first comparison input end v of comparing unit 60, in the first switch status, the modified first reference voltage Vref1A comes to be applied. Therefore, in the prescribed time period of the next cycle, the threshold voltage for the comparing operation becomes lower. Specifically, comparing unit 60 performs a hysteresis operation. The hysteresis width is Vref1A−Vref1. Further, the hysteresis width can be determined simply by setting the first reference voltage and the modified first reference voltage Vref1 and Vref1A, and hence, design and adjustment are easy.

In the present invention, the first and second capacitors 41 and 42 are charged to attain prescribed state in the first switch status, whereby the input voltage reference value of comparing unit 60 is set to the prescribed first and second reference voltages Vref1 and Vref2. By setting the first and second reference voltages Vref1 and Vref2 to a value as close as possible to the mid point voltage (Vcc/2) of the power supply voltage Vcc, it becomes possible to set a large input dynamic range.

Further, supply of the power supply voltage to main units such as amplifying unit 30 and comparing unit 60 is performed intermittently at every first interval T1, and by combining the intermittent operation and the latch operation based on the detection signal Sdet, power consumption can be reduced while stable detection of magnetism is realized.

Since the power consumption is reduced by the intermittent operation and stable detection of magnetism is possible as described above, the magnetic sensor circuit in accordance with the present invention is particularly suitable for a sensor circuit of a portable terminal (for example, a folding type or rotating type portable telephone) using a battery or the like as a power source.

Description has been given assuming that the magnetic field to Hall element 10 is in one certain direction. If the magnetic field is in the opposite direction, however, the generated Hall voltage naturally comes to have the opposite polarity. In that case, circuit configuration is altered in accordance with the polarity of Hall voltage.

Second Embodiment

As a second embodiment, a magnetic sensor circuit capable of detecting magnetic field strength independent of the direction of magnetic field to the Hall element will be described.

Figure 6:
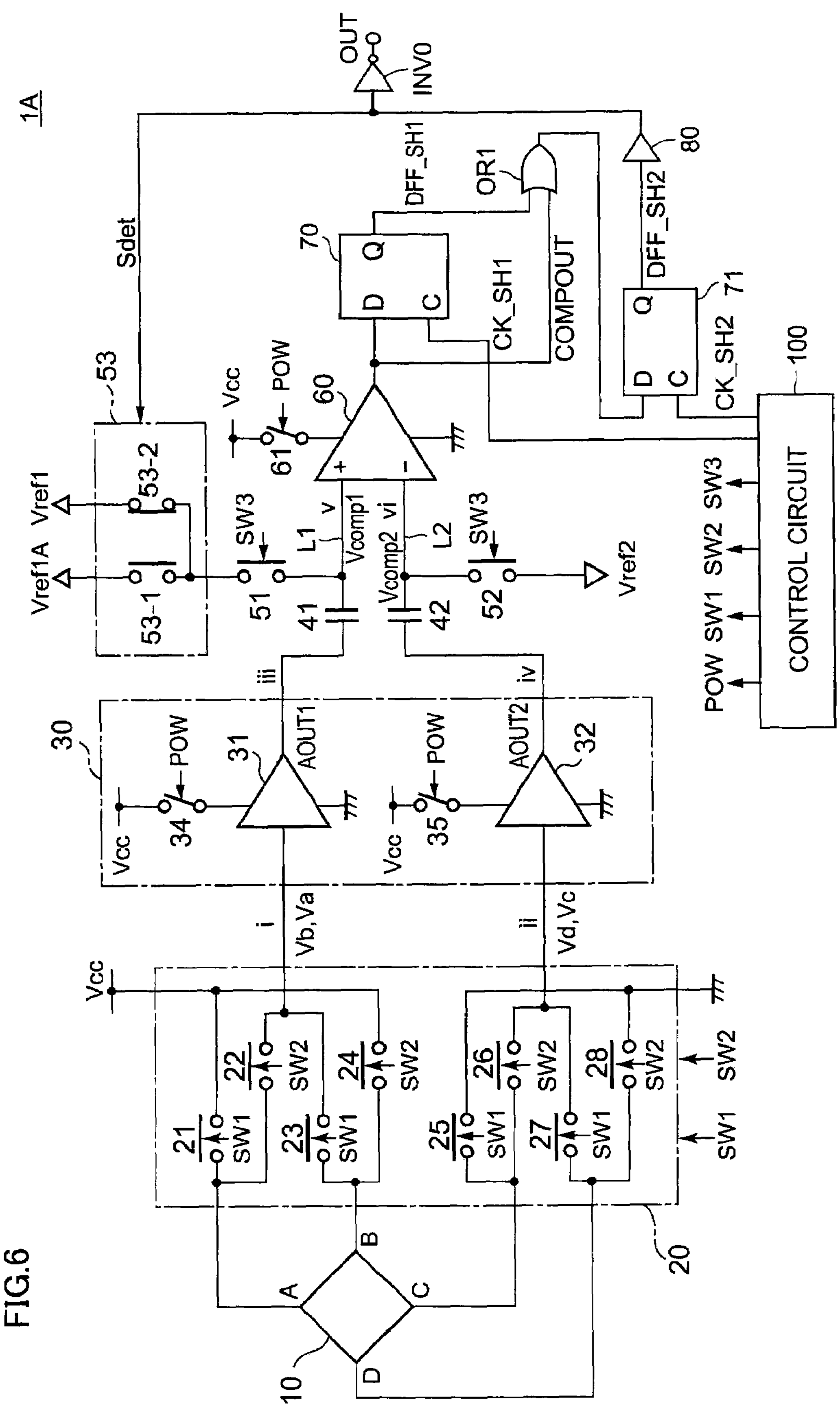
FIG. 6 shows a configuration of a magnetic sensor circuit in accordance with a second embodiment of the present invention.

FIG. 6 shows a configuration of the magnetic sensor circuit in accordance with the second embodiment of the present invention. Referring to FIG. 6, a magnetic sensor circuit 1A differs from the magnetic sensor circuit shown in FIG. 1 in that it includes a control circuit 100, an OR circuit OR1, a latch circuit 71 and an inverter INV0. Except for these portions, configuration of magnetic sensor circuit 1A is the same as that of the magnetic sensor shown in FIG. 1, and therefore, description thereof will not be repeated.

Control circuit 100 outputs power-on signal POW, the first, second and third switch signals SW1, SW2 and SW3, and clock signals CK_SH1 and CK_SH2. The third switch signal SW3 is applied to the first and second switch circuits 51 and 52.

Latch circuit 70 latches a signal COMPOUT (comparison output) output from comparing unit 60 at a rising timing of clock signal CK_SH1. OR circuit OR1 receives the signal COMPOUT and a signal DFF_SH1 (first latch output) output from latch circuit 70. Latch circuit 71 latches an output of OR circuit OR1 at a rising timing of clock signal CK_SH2. Similar to latch circuit 70, a D-type flip-flop is suitably used for latch circuit 71.

Buffer amplifier 80 amplifies the signal DFF_SH2 (second latch output) output from latch circuit 71, and outputs the detection signal Sdet. Inverter INV0 inverts the detection signal Sdet and outputs a signal OUT. In accordance with the signal OUT, whether the magnetic field intensity is a prescribed intensity or not is determined.

Figure 7:
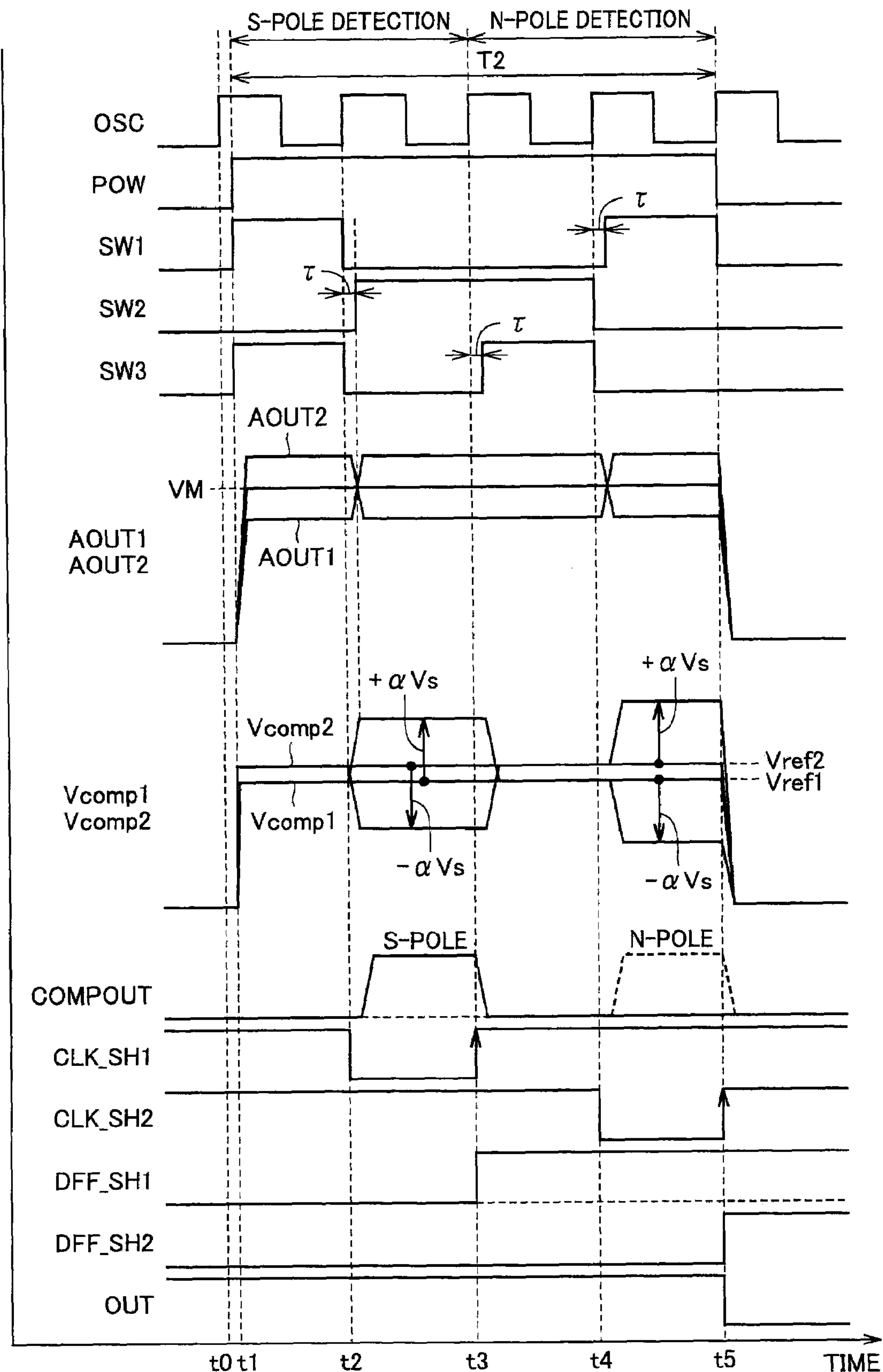
FIG. 7 is a timing chart representing an operation of the magnetic sensor circuit in accordance with the second embodiment of the present invention.

FIG. 7 is a timing chart illustrating the operation of magnetic sensor circuit in accordance with the second embodiment of the present invention. Referring to FIG. 7, the signal OSC is a signal serving as a reference for the operation of control circuit 100. As will be described later, the signal OSC is generated inside the control circuit 100.

As in the first embodiment, the power-on signal POW is generated at every first interval T1 for a prescribed time period T2. The period from t1 to t5 corresponds to the prescribed time period T2. The prescribed time period T2 includes first to fourth periods. Specifically, the periods from t1 to t2, t2 to t3, t3 to t4 and t4 to t5 correspond to the first to fourth periods, respectively.

In the following, description will be given assuming that the magnetic field intensity of S-polarity is detected in the first and second periods and the magnetic field intensity of N-polarity is detected in the third and fourth periods. The magnetic field polarities to be detected may be in reverse order.

The operation of magnetic sensor circuit 1A from t1 to t3 is the same as that of the magnetic sensor circuit in accordance with the first embodiment. After the signal OSC rises at time point to, the power-on signal POW generates at time point t1. Almost simultaneously with the generation of power-on signal POW, the first and third switch signals SW1 and SW3 are generated. By the generation of first switch signal SW1, switch selecting circuit 20 is set to the first switch status. Further, by the generation of third switch signal SW3, the first and second switch circuits 51 and 52 are both turned on.

Voltages AOUT1 and AOUT2 represent outputs of the first and second amplifying circuits, respectively. In the period from t1 to t2, the voltage AOUT1 is $\alpha$(Vb−Voffa1), and the voltage AOUT2 is $\alpha$(Vd−Voffa2). Further, the first comparison voltage Vcomp1 at the first comparison input end v of comparing unit 60 is the first reference voltage Vref1, and the second comparison voltage Vcomp2 at the second comparison input end vi is the second reference voltage Vref2. In the absence of any signal from Hall element 10, the voltages AOUT1 and AOUT2 are the same as the voltage VM.

In the second period, control circuit 100 sets switch selecting circuit 20 such that the second switch status starts after the prescribed short period $\tau$ from the end (time point t2) of the first switch status. In the period from t2 to t3, the voltage AOUT1 is $\alpha$(Va−Voffa1) and the voltage AOUT2 is $\alpha$(Vc−Voffa2). As represented by Equations 1 and 2 above, the first comparison voltage Vcomp1 is Vref1−$\alpha$(Vb−Va), and the second comparison voltage Vcomp2 is Vref2−$\alpha$(Vd−Vc). When we represent the Hall voltage (terminal-to-terminal voltage) by Vs, the first comparison voltage Vcomp1 changes from Vref1 by +$\alpha$Vs, and the second comparison voltage Vcomp2 changes from Vref2 by −$\alpha$Vs.

When the signal OSC rises at time point t3, the third switch signal SW3 is again generated after the prescribed short period τ. In response to the generation of third switch signal SW3, the first comparison voltage Vcomp1 changes to the first reference voltage Vref1, and the second comparison voltage Vcomp2 changes to the second reference voltage Vref2. As switch selecting circuit 20 is kept in the second switch status, voltages AOUT1 and AOUT2 are kept at α(Va−Voffa1) and α(Vc−Voffa2), respectively.

In the fourth period, control circuit 100 sets switch selecting circuit 20 such that the first switch status starts after the prescribed short period τ from the end (time point t4) of the second switch status. Consequently, the voltage AOUT1 changes to α(Vb−Voffa1) and the voltage AOUT2 changes to α(Vd−Voffa2). The first comparison voltage Vcomp1 changes to Vref1−α(Va−Vb), and the second comparison voltage Vcomp2 changes to Vref2−α(Vc−Vd). Specifically, in the fourth period, the first comparison voltage Vcomp1 changes from Vref1 by −αVs and the second comparison voltage Vcomp2 changes from Vref2 by +αVs.

If the magnetic field has a prescribed intensity or higher, a signal is output from Hall element 10, and therefore, an H level signal COMP OUT is obtained. The period in which the signal COMPOUT is at the H level is from t2 to t3 if the magnetic field is of S-polarity. If the magnetic field is of N-polarity, the period in which the signal COMPOUT is at the H level is from t4 to t5.

The clock signal CK_SH1 falls at time point t2, and rises at t3. If the signal COMPOUT is at the H level at time point t3, the signal DFF_SH1 changes from the L level to the H level.

The clock signal CK_SH2 falls at time point t4, and rises at t5. At time point t5, the output of OR circuit OR1 is at the H level, and therefore the signal DFF_SH2 changes from the L level to the H level, and the signal OUT changes from the H level to the L level.

If the signal COMPOUT is at the H level at time point t5, the output of OR circuit OR1 has attained to the H level in response to the signal COMPOUT. Therefore, when clock signal CK_SH2 rises at time point t5, the signal DFF_SH2 changes from the L level to the H level, and the signal OUT changes from the H level to the L level.

That the signal OUT changes from the H level to the L level means that the magnetic field intensity is not lower than a prescribed intensity. As described above, control circuit 100 sets switch selecting circuit 20 to the first switch status in the first and fourth periods, and sets switch selecting circuit 20 to the second switch status in the second and third periods. Further, control circuit 100 turns on the first and second switch circuits 51 and 52 in the first and third periods. Therefore, it is possible for magnetic sensor circuit 1A to detect that the magnetic field intensity is not lower than the prescribed intensity, independent of the direction of magnetic field to Hall element 10.

Further, control circuit 100 provides a prescribed short time period τ between the fall of first switch signal SW1 and the rise of second switch signal SW2 and between the fall of second switch signal SW2 and the rise of first switch signal SW1. Accordingly, the first and second comparison voltages Vcomp1 and Vcomp2 become stable, and hence, malfunction of magnetic sensor circuit 1A can be prevented.

Further, control circuit 100 continuously outputs the second switch signal SW2 from t2 to t4, and hence, it is possible for magnetic sensor circuit 1A to detect magnetic field intensity of both polarities in a short period of time.

Further, control circuit 100 outputs the second power-on signal POW only for a prescribed time period T2, so that magnetic sensor circuit 1A operates intermittently. As a result, power consumption of magnetic sensor circuit 1A can be reduced.

Next, control circuit 100 will be described in detail.

Figure 8:
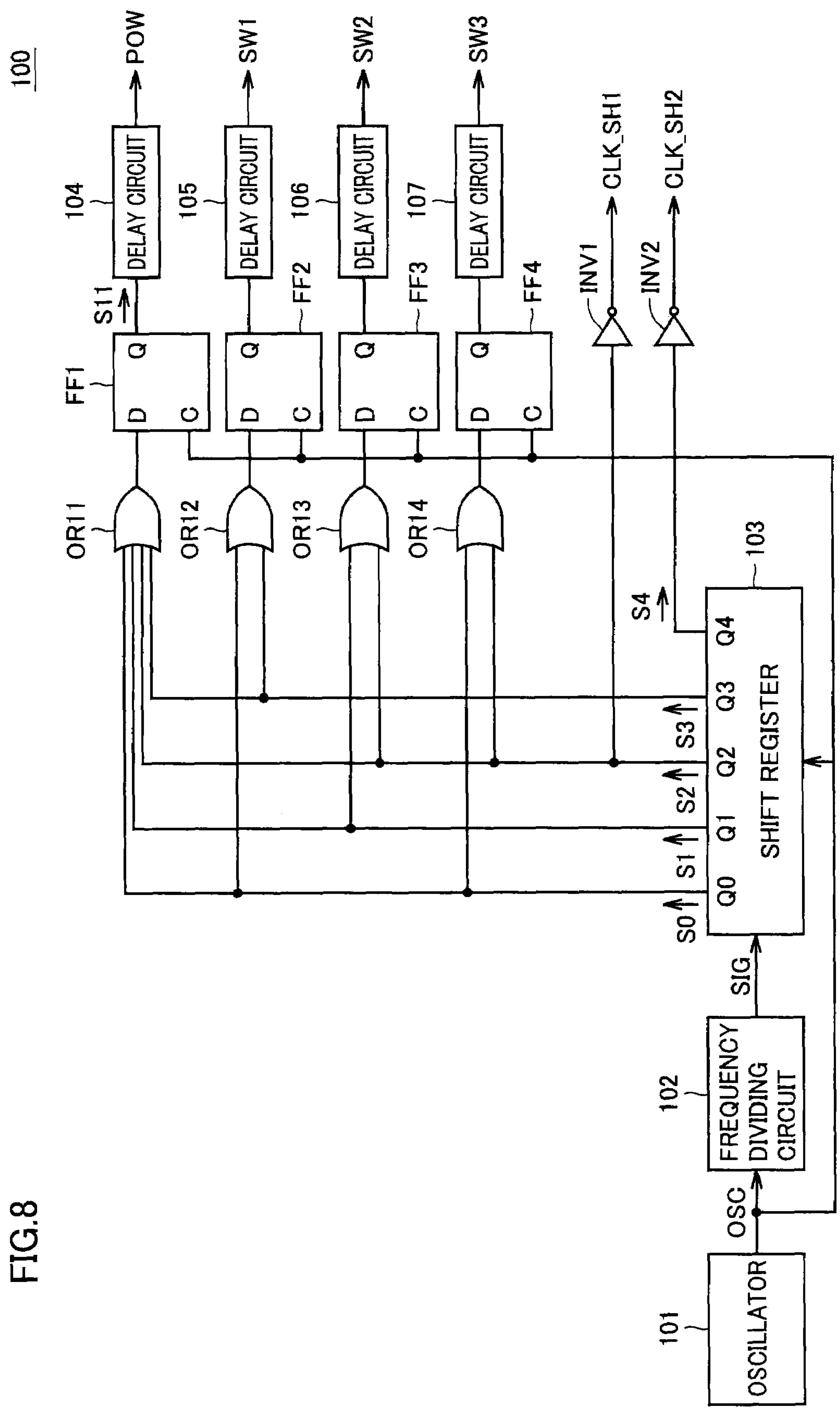
FIG. 8 shows a configuration of a control circuit 100 of FIG. 6.

FIG. 8 shows a configuration of control circuit 100 of FIG. 6.

Referring to FIG. 8, control circuit 100 includes an oscillator 101 outputting the signal OSC; a frequency dividing circuit 102 dividing the frequency of signal OSC by a prescribed ratio of frequency division (for example, 1/4096) to output a signal SIG; and a shift register 103 receiving signals SIG and OSC and successively outputting signals S0 to S4 at every pulse of signal OSC. Shift register 103 outputs signals S0 to S4 from terminals Q0 to Q4, respectively.

Control circuit 100 further includes OR circuits OR1 to OR14. OR circuit OR1 receives signals S0 to S3. OR circuit OR12 receives signals S0 and S3. OR circuit OR13 receives signals S1 and S2. OR circuit OR14 receives signals S0 and S2.

Control circuit 100 further includes D-type flip-flops FF1 to FF4 latching outputs of OR circuits OR11 to OR14, respectively, in response to the rise of signal OSC.

Control circuit 100 includes delay circuits 104 to 107 delaying outputs of D-type flip-flops FF1 to FF4, respectively, and inverters INV1 and INV2. Delay circuits 104 to 107 output power-on signal POW, the first switch signal SW1, the second switch signal SW2 and the third switch signal SW3, respectively. Inverter INV1 inverts the signal S2 to output clock signal CK_SH1. Inverter INV2 inverts the signal S4 to output clock signal CK_SH2.

Each of the delay circuits 101 to 104 delays only the rise of the output of D-type flip-flops. Therefore, it becomes possible to provide the prescribed short time period τ shown in FIG. 7 between the first and second switch signals SW1 and SW2.

Figure 9:
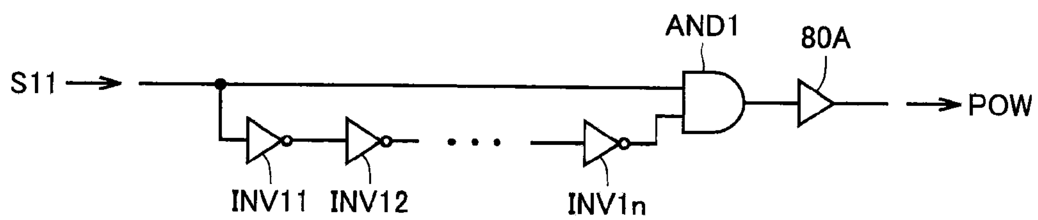
FIG. 9 shows an exemplary configuration of a delay circuit 104 of FIG. 8.

FIG. 9 shows an exemplary configuration of delay circuit 104 of FIG. 8.

Referring to FIG. 9, delay circuit 104 includes n (n is an even number) inverters INV11~INV1*n* connected in series, an AND circuit AND1 and a buffer amplifier 80A. To inverter INV11 and to one input terminal of AND circuit AND1, a signal S11 (output of D-type flip-flop FF1) is input. To the other input terminal of AND circuit AND1, a signal from inverter INV1*n* is input. Buffer amplifier 80A amplifies an output of AND circuit AND1 and outputs power-on signal POW. Here, the number n of inverters may be determined appropriately as needed.

Each of the delay circuits 105 to 107 has the same configuration as delay circuit 104 and, therefore, description thereof will not be repeated.

Next, an exemplary configuration for stabilizing operation of the magnetic sensor circuit in accordance with the present invention will be described. Since the magnetic sensor circuit of the present invention includes comparing unit 60, it is less susceptible to the influences of noise and ripples of power supply voltage, and stable operation is realized. As an example of a configuration for further stabilizing the operation, an exemplary configuration of first and second capacitors 41 and 42 and signal lines L1 and L2 connected to the first and second comparison input ends v and vi, respectively, will be described.

Figure 10:
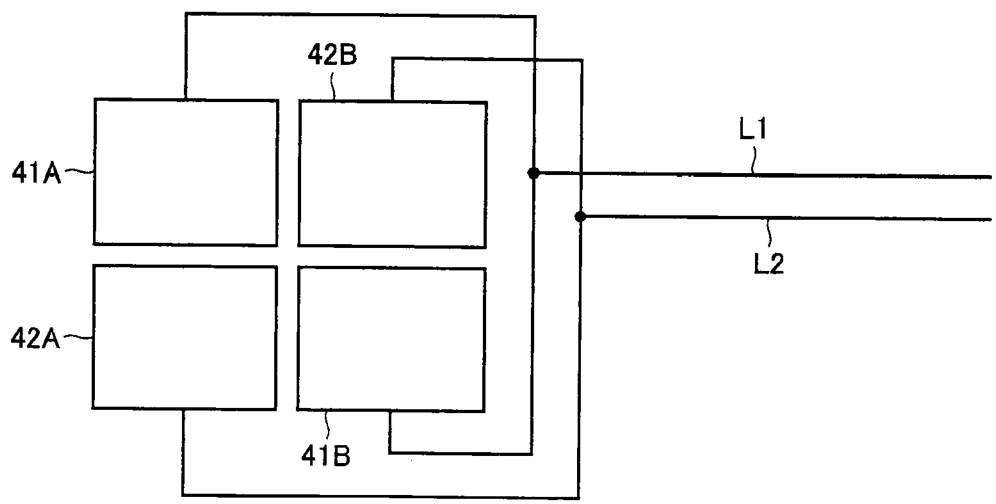
FIG. 10 schematically shows exemplary configurations of signal lines L1 and L2 and first and second capacitors 41 and 42.

FIG. 10 is a schematic diagram showing the exemplary configuration of signal lines L1 and L2 and first and second capacitors 41 and 42.

Referring to FIG. 10, the first capacitor 41 is divided into capacitors 41A and 41B, and the second capacitor 42 is divided into capacitors 42A and 42B. Along two sides of capacitor 41A, capacitors 42A and 42B are arranged. Capacitor 41B is provided opposite to capacitor 41A with respect to capacitors 42A and 42B.

By such an arrangement of capacitors, portions of capacitors opposite to each other increases. By way of example, when a voltage at one end of capacitor 41A varies because of noise, potentials of capacitors 41A, 42A and 42B vary similarly. As the noise components of the same phase can be cancelled by comparing unit 60, the influence of noise can be reduced. Therefore, a stable operation becomes possible.

Signal lines L1 and L2 have portions arranged parallel to each other. When noise of the same phase is applied to signal lines L1 and L2, noise components of the same phase are cancelled by comparing unit 60, and therefore, a stable operation becomes possible.

It is noted that areas of first and second capacitors 41 and 42 are set such that capacitance values of the first and second capacitors 41 and 42 become larger than the parasitic capacitance of signal lines L1 and L2. For instance, at the switching from the first period to the second period, voltage AOUT1 changes by $+\alpha Vs$ and voltage AOUT2 changes by $-\alpha Vs$. When the first and second switch circuits 51 and 52 are turned off in the second period, however, charges accumulated as the parasitic capacitance of signal lines L1 and L2 are discharged and, as a result, voltages at the first and second comparison input ends v and vi may possibly become smaller than $Vref1+\alpha Vs$ and $Vref2-\alpha Vs$, respectively. By increasing the areas of first and second capacitors 41 and 42, larger amount of charges come to be stored in the first and second capacitors 41 and 42, and therefore, decrease of voltages at the first and second comparison input ends v and vi can be prevented even when charges accumulated at the parasitic capacitance of signal lines L1 and L2 are discharged.

Figure 11:
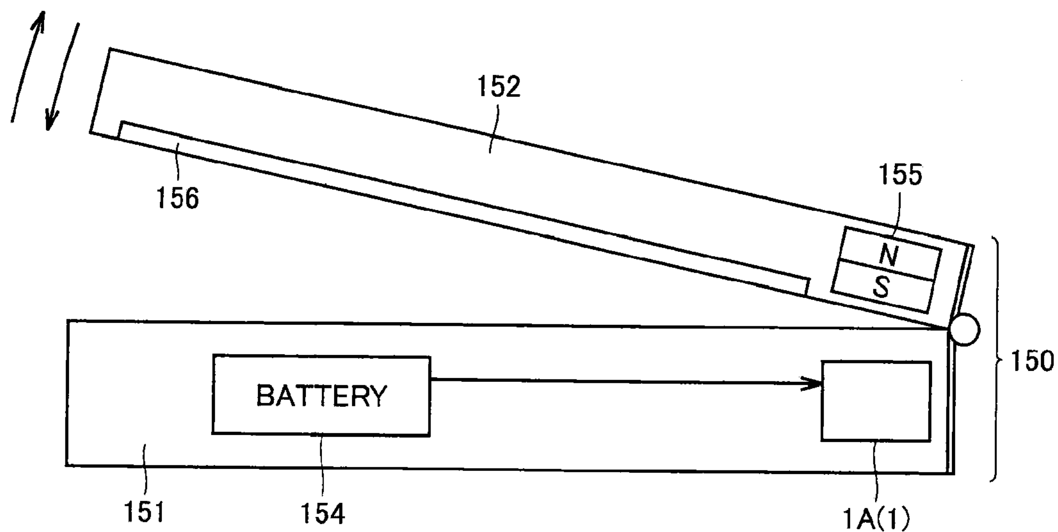
FIG. 11 shows an example of application of a magnetic sensor circuit 1A.

FIG. 11 shows an exemplary application of magnetic sensor circuit 1A.

Referring to FIG. 11, a portable telephone 150 is a folding type portable telephone, which corresponds to the portable terminal in accordance with the present invention. Portable telephone 150 has a body 151 and a housing 152. Body 151 includes magnetic sensor circuit 1A and a battery 154 feeding power supply voltage to magnetic sensor circuit 1A. Housing 152 includes a magnet 155 and a display unit 156.

Since the distance between magnet 155 and magnetic sensor circuit 1A changes as housing 152 moves, magnetic field intensity to magnetic sensor circuit 1A changes accordingly. Magnetic sensor circuit 1A operates as an opening/closing detection sensor, by detecting the magnetic field intensity.

Magnetic sensor circuit 1A is capable of detecting magnetic field intensity no matter which of the S-pole and N-pole of magnet 155 faces to the side of display 156. Therefore, it is unnecessary to confirm orientation of the magnet when magnet 155 is mounted on housing 152. This improves productivity of portable telephones.

When an image picked up by a camera (not shown) contained in body 151 is monitored on display 156, portable telephone 150 may be used with housing 152 rotated to have display 156 face outward. Even in that case, sensor circuit 1A can detect magnetic field intensity of N-polarity. Therefore, the area necessary for mounting becomes smaller and the power consumption of portable telephone can be reduced than when two magnetic sensor circuits each capable of detecting magnetic field of either one polarity are provided.

As shown in FIG. 11, magnetic sensor circuit 1 in accordance with the first embodiment can also be mounted on a portable telephone 150. In that case, however, magnet 155 is mounted on housing 152 such that the polarity of the surface on the side of display 156 is either N pole or S pole.

Figure 5:
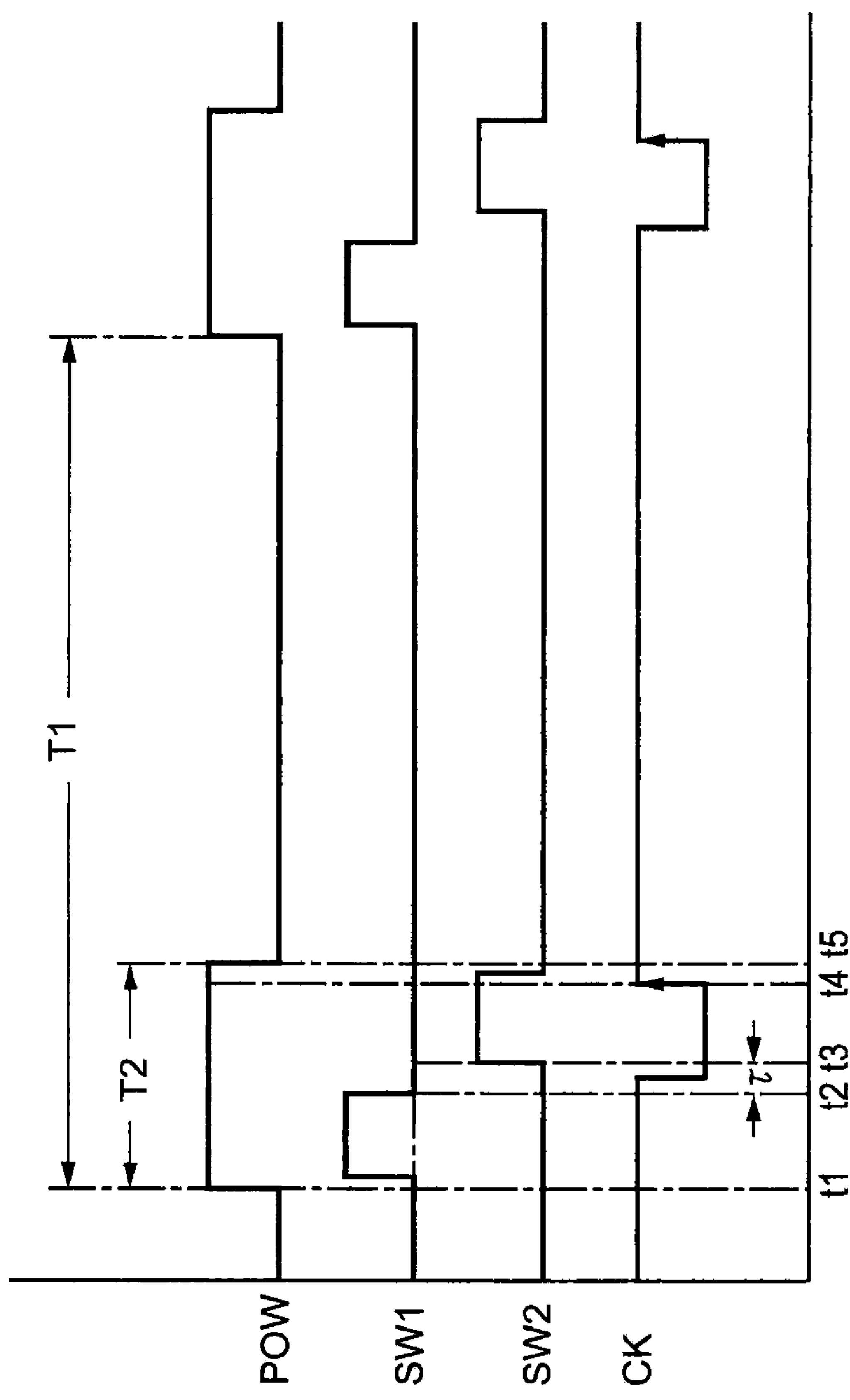
FIG. 5 is a timing chart representing an operation of the magnetic sensor circuit in accordance with the first embodiment of the present invention.

Further, control circuit 100 may output the power-on signal POW and the first and second switch signals SW1 and SW2, in accordance with the timing chart shown in FIG. 5.

As described above, according to the second embodiment of the present invention, a control circuit is provided for controlling a switch selecting circuit switching an output of the Hall element and a switch for applying a reference voltage at an input end of the comparing unit, so that magnetic field intensity can be detected regardless of the polarity.

Third Embodiment

As a third embodiment, a magnetic sensor circuit capable of compensating for temperature characteristic of detection sensitivity in detecting magnetic field intensity will be described. The overall configuration of magnetic sensor circuit in accordance with the third embodiment is the same as the configuration of magnetic sensor circuit shown in FIG. 1 (or FIG. 6), and therefore, description thereof will not be repeated.

Figure 12:
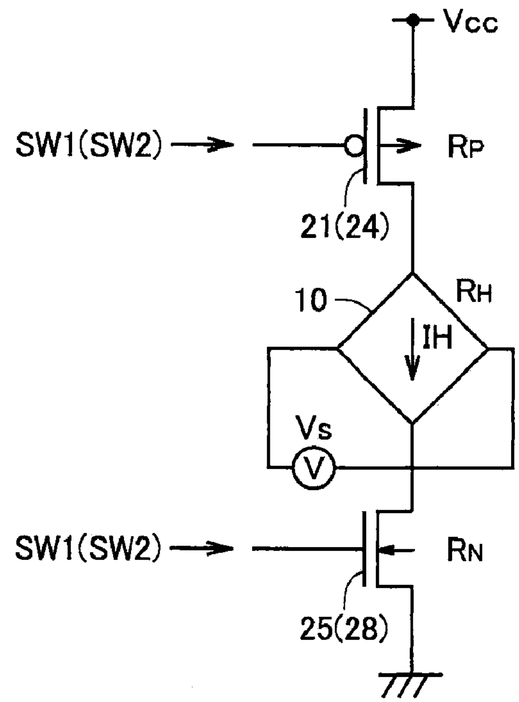
FIG. 12 illustrates a current flowing through a Hall element 10 of FIG. 1.

FIG. 12 shows a current flowing through Hall element 10 shown in FIG. 1.

Referring to FIG. 12, switches 21 and 24 are formed of P-type MOS transistors, and switches 25 and 28 are formed of N-type MOS transistors. The value of ON resistance of the P-type MOS transistor is RP, and that of N-type MOS transistor is RN. Hall element 10 has resistance value RH. Hall voltage Vs output from Hall element 10 is represented as:

$$Vs=KH\times IH\times B \tag{5}$$

Here, KH represents Hall coefficient, IH represents a current flowing through Hall element 10, and B represents magnetic field density (design value of magnetic flux density at which the magnetic sensor circuit reacts). As can be seen from Equation 5, voltage Vs is in proportion to current IH.

Current IH is represented as:

$$IH=Vcc/(RP+RH+RN) \tag{6}$$

Figure 13:
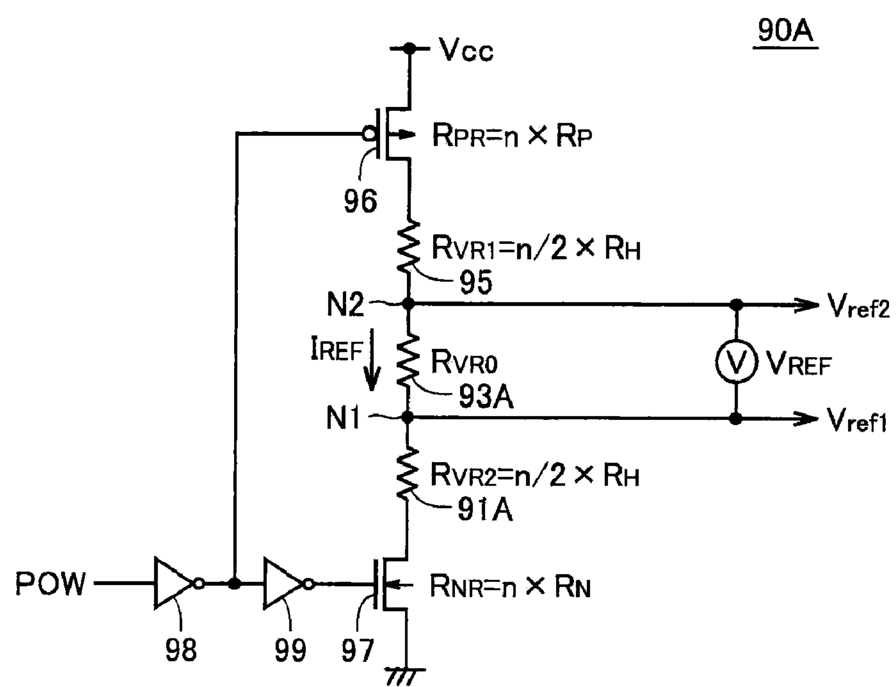
FIG. 13 shows a reference voltage generating circuit applied to a third embodiment of the present invention.

FIG. 13 shows a reference voltage generating circuit applied to the third embodiment of the present invention.

Referring to FIG. 13, a reference voltage generating circuit 90A is applicable to the magnetic sensor circuits in accordance with the first and second embodiments of the present invention. Reference voltage generating circuit 90A is different from reference voltage generating circuit 90 of FIG. 4 in that it includes voltage dividing resistors 91A and 93A in place of voltage dividing resistors 91~94. Except for this point, it is the same as reference voltage generating circuit 90, and therefore, description thereof will not be repeated.

Voltage dividing resistor 93A is connected between a first reference voltage end N1 outputting the first reference voltage Vref1 and a second reference voltage end N2 outputting the second reference voltage Vref2. Voltage dividing resistor 91A has one end connected to the first reference voltage end N1. Voltage dividing resistor 95 has one end connected to the second reference voltage end N2. When power-on signal POW is generated, the other end of voltage dividing resistor 91A may be coupled to the ground potential. Further, when power-on signal POW is generated, the other end of voltage dividing resistor 95 may be coupled to the power supply voltage Vcc.

Voltage dividing resistor 91A corresponds to a resistor formed by combining voltage dividing resistors 91 and 92. Further, voltage dividing resistor 93A corresponds to a resistor formed by combining voltage dividing resistors 91 and 92 shown in FIG. 4.

Here, resistance value RVR1 of voltage dividing resistor 95 and resistance value RVR2 of voltage dividing resistor 91A are both n/2×RH. Resistance value RVR0 of voltage dividing resistor 93A is smaller than the sum of resistance values RVR1 and RVR2, and the relation n×RH>>RVR0 holds.

Let us represent the voltage across opposite ends of voltage dividing resistor 93A by VREF (=Vref2−Vref1), and the current flowing through voltage dividing resistor 93A by IREF. The voltage VREF is given by:

$$VREF=IREF\times RVR0 \quad (7)$$

Further, the value of ON resistance of P-type MOS transistor 96 is represented by RPR, and that of N-type MOS transistor 97 is represented by RNR. The values RPR and RNR are n-times multiple of ON resistances of P-type MOS transistor and N-type MOS transistor shown in FIG. 12, and the relations RPR=n×RP and RNR=n×RN are satisfied. Here, the current IREF is given by Equation 8.

$$IREF=Vcc/\{n(RP+RH+RN)+RVR0\} \quad (8).$$

Since the relation n×RH>>RVR0 holds, RVR0 is negligible in Equation 8. Therefore, from Equations 6 and 8, the relation between current IH and current IREF can be represented by Equation 9.

$$IH=n\times IREF \quad (9)$$

Further, from Equations 5, 7 and 9, sensitivity (=Vs/VREF) of the magnetic sensor circuit can be given by Equation 10.

$$Vs/VREF=n\times KH\times B/RVR0 \quad (10).$$

From Equation 10, when the resistance value RVR0 of voltage dividing resistor 93A changes slightly with temperature (for example, when the amount of change is smaller than the change of resistance value RH with temperature, or 0), temperature characteristic of the sensitivity can be compensated for. Though the sensitivity depends on resistance ratio n, n is constant as long as the temperature characteristic of current IH is the same as the temperature characteristic of current IREF, from Equation 9. Specifically, when the temperature characteristic of resistance value of each of the voltage dividing resistors in voltage dividing resistors 91A and 95 is the same as the temperature characteristic of resistance value RH, the temperature characteristic of sensitivity can be compensated for.

Specifically, conditions for compensating the temperature characteristic of sensitivity are as follows. The first condition is that the resistance value of voltage dividing resistor 93A is smaller than the sum of resistance values of voltage dividing resistors 91A and 95. The second condition is that an amount of change with temperature of the resistance value of voltage dividing resistor 93A is smaller than the amount of change with temperature of electric resistance value of Hall element 10. The third condition is that temperature coefficients of resistance values of voltage dividing resistors 91 and 95 are both the same as the temperature coefficient of electric resistance value of Hall element 10.

In order to set voltage dividing resistors 91A and 95 as well as Hall element 10 in this manner, for example, Hall element 10 and voltage dividing resistors 91A and 95 may be formed by using resistance elements (for example, diffusion resistance) of the same type material in one same semiconductor substrate.

Figure 18:
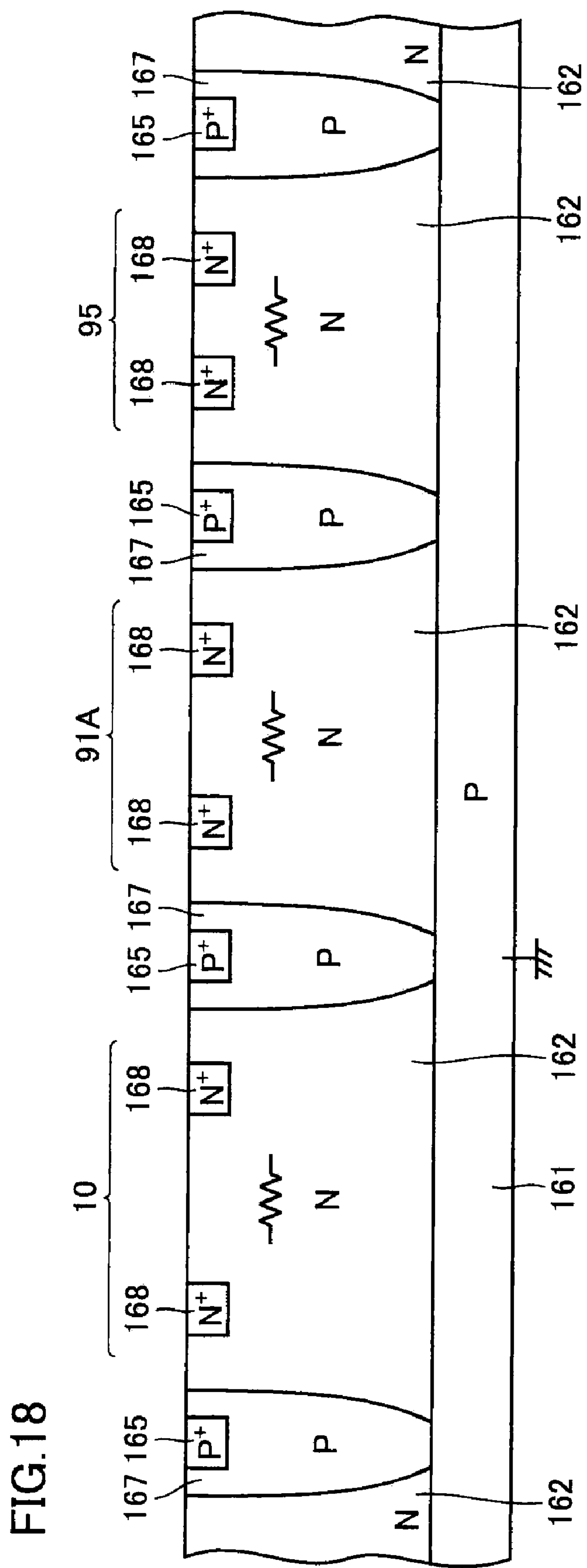
FIG. 18 shows an exemplary structure of a Hall element 10 and voltage dividing resistors 91A and 95.

FIG. 18 shows an exemplary structure of Hall element 10 and voltage dividing resistors 91A and 95.

Referring to FIG. 18, an N-type epitaxial layer 162 is formed on a P-type substrate 161. Further, in order to reduce contact resistance between N-type epitaxial layer 162 and a metal interconnection (not shown), an N-type diffusion layer 168 of high carrier concentration is formed in N-type epitaxial layer 162. By P-type diffusion layers 165 and buried P-type diffusion layers 167, N-type epitaxial layer 162 is divided into a plurality of regions. Each of the plurality of regions functions as the “resistance element” described above. Further, P-type substrate 161 corresponds to the “semiconductor substrate” described above.

Figure 19:
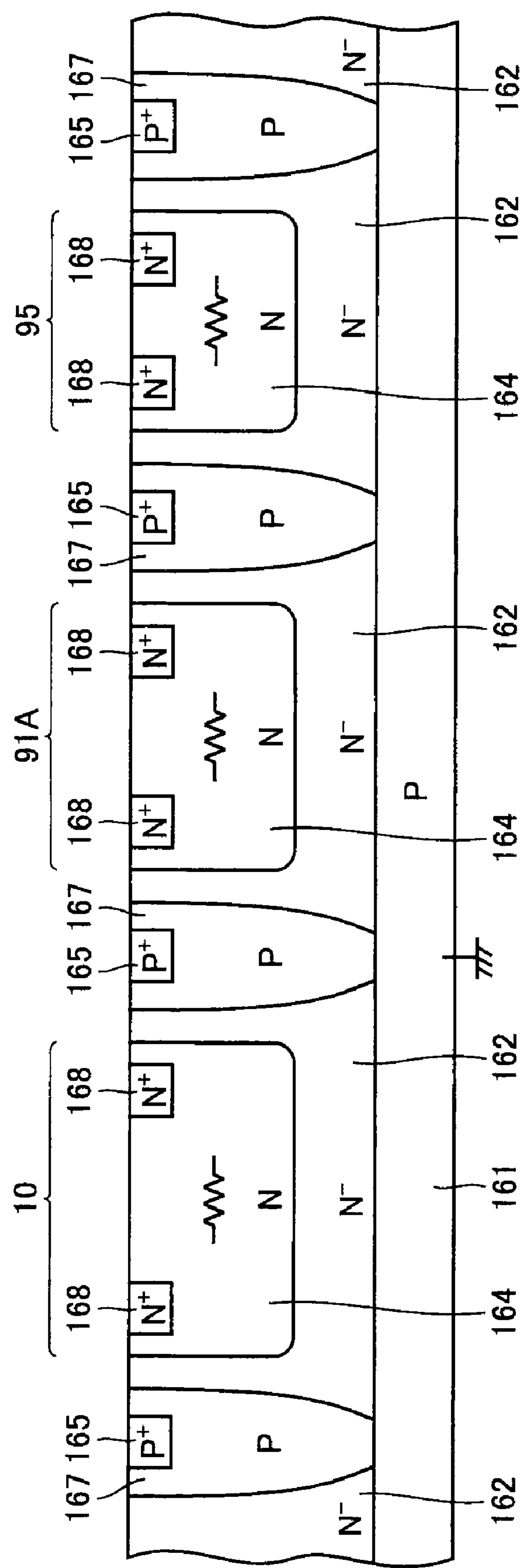
FIG. 19 shows another exemplary structure of Hall element 10 and voltage dividing resistors 91A and 95.

FIG. 19 shows another exemplary structure of Hall element 10 and voltage dividing resistors 91A and 95.

Referring to FIG. 19, an N-type diffusion layer 164 is formed in N-type epitaxial layer 162. In this point, the structure of Hall element 10 and voltage dividing resistors 91A and 95 shown in FIG. 19 is different from the structure of Hall element 10 and voltage dividing resistors 91A and 95 shown in FIG. 18. Except for this point, the structure is the same as that shown in FIG. 18. Since N-type epitaxial layer 162 has lower carrier concentration than N-type diffusion layer 164, it is denoted as an “N-layer” in FIG. 19.

In FIG. 19, P-type substrate 161 and N-type epitaxial layer 162 correspond to the “semiconductor substrate” described above, and N-type diffusion layer 164 corresponds to the “resistance element.” When N-type diffusion layer 164 formed in N-type epitaxial layer 162 is used as Hall element 10 as shown in FIG. 19, sensitivity of Hall element 10 can be improved.

As described above, according to the third embodiment, by using a voltage dividing resistor having the same temperature characteristic as the resistor of Hall element and a voltage dividing resistor having smaller resistance value and smaller temperature coefficient than said voltage dividing resistor in the reference voltage generating circuit, it becomes possible to compensate for temperature characteristic of detection sensitivity.

Fourth Embodiment

In a magnetic sensor circuit in accordance with a fourth embodiment, the first period T1 can be made shorter as compared with the magnetic sensor circuits in accordance with the first to third embodiments.

Figure 14:
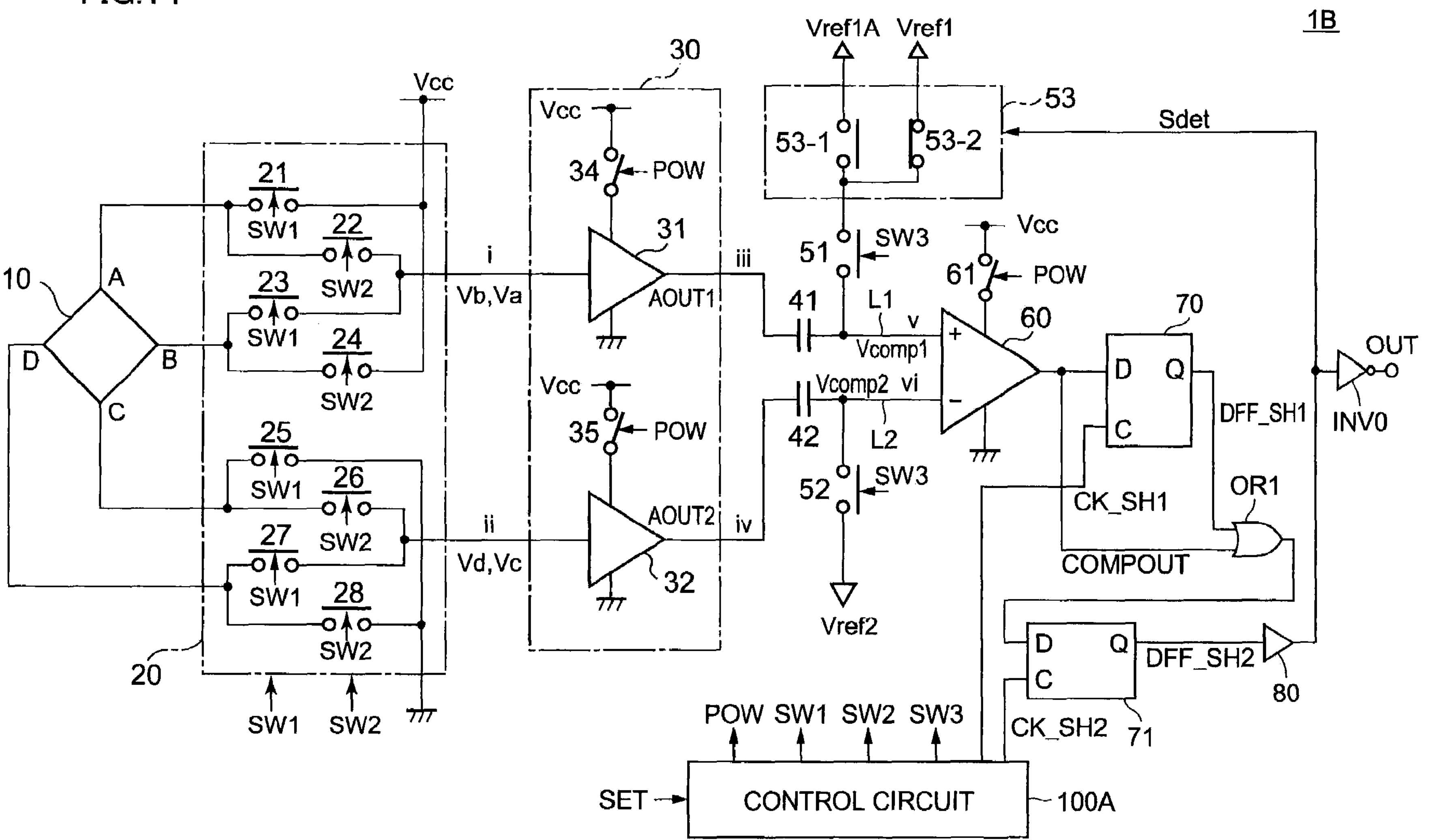
FIG. 14 shows a configuration of a magnetic sensor circuit in accordance with a fourth embodiment of the present invention.

FIG. 14 shows a configuration of a magnetic sensor circuit in accordance with a fourth embodiment of the present invention.

Referring to FIG. 14, a magnetic sensor circuit 1B is different from magnetic sensor circuit 1A shown in FIG. 6 in that it includes a control circuit 100A in place of control circuit 100. Except for this point, it is the same as magnetic sensor circuit 1A and, therefore, description thereof will not be repeated.

In response to an input signal SET, control circuit 100A makes the length of the first period T1 shorter than when the signal SET is not input. The length of first period T1 is, for example, 50 ms if the signal SET is not input, and it is, for example, 0.2 ms if the signal SET is input.

By making shorter the length of first period T1 at a step of inspection before shipment of magnetic sensor circuits than at a normal operation, the time necessary for inspection can be reduced. This improves productivity of magnetic sensor circuits.

Figure 15:
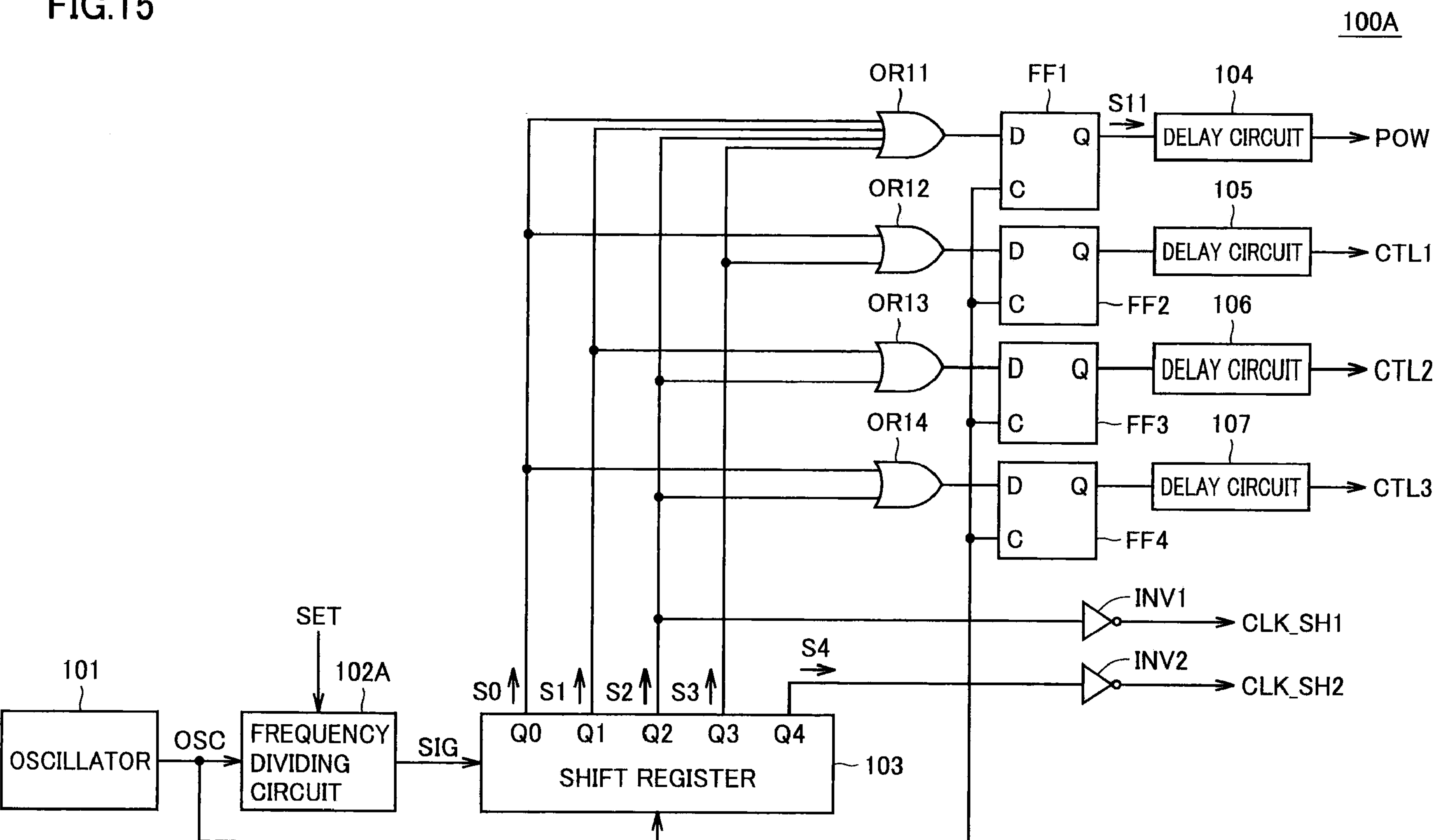
FIG. 15 shows a configuration of a control circuit 100A of FIG. 14.

FIG. 15 shows a configuration of control circuit 100A shown in FIG. 14.

Referring to FIG. 15, control circuit 100A is different from control circuit 100 in that it includes a frequency dividing circuit 102A in place of frequency dividing circuit 102. Except for this point, it is the same as control circuit 100 and, therefore, description thereof will not be repeated.

Frequency dividing circuit 102A changes frequency division ratio of signal OSC in response to the input of signal SET. Thus, when the signal SET is input, the first period T1 can be made shorter.

Figure 16:
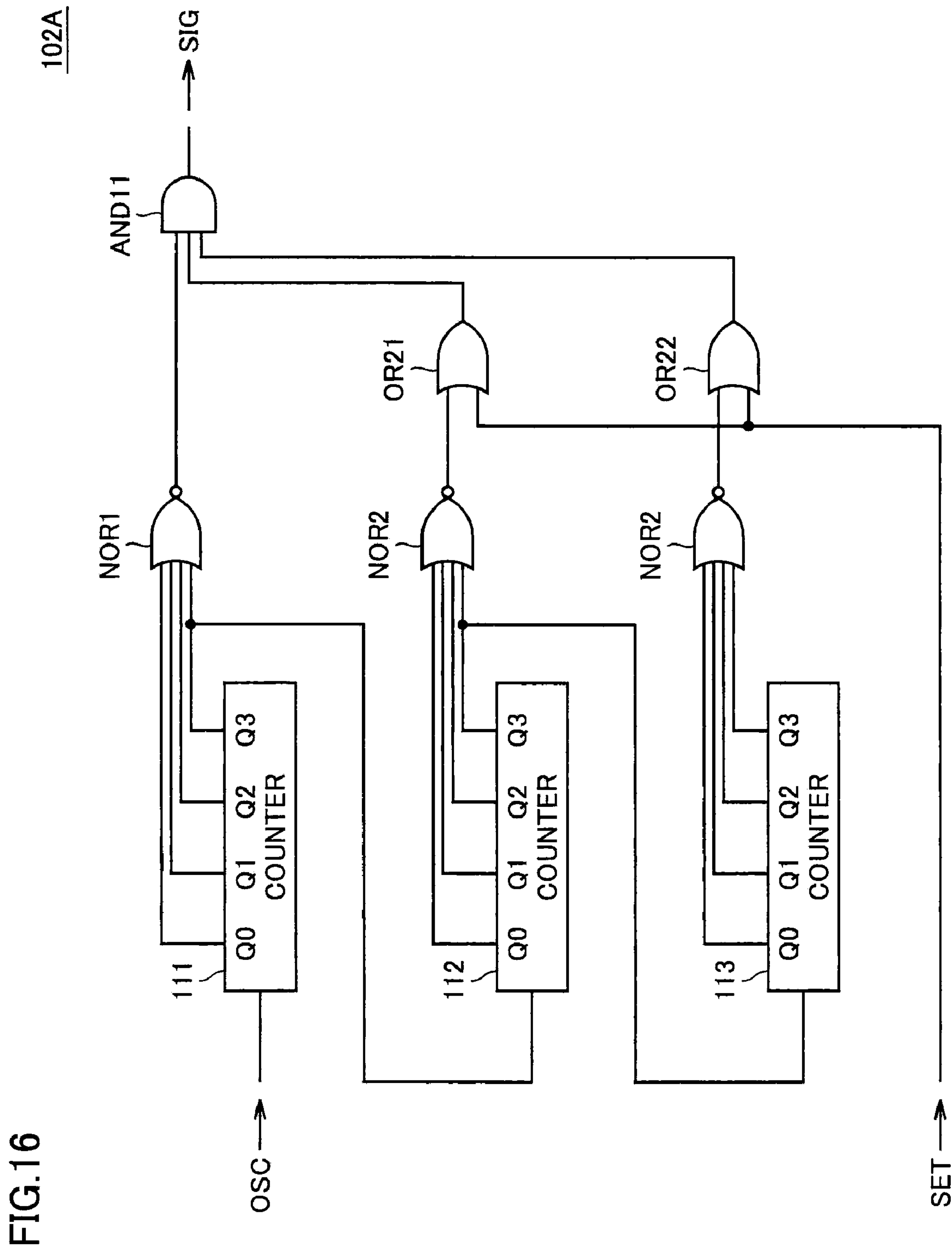
FIG. 16 shows an exemplary configuration of a frequency-dividing circuit 102A of FIG. 15.

FIG. 16 shows an exemplary configuration of frequency dividing circuit 102A shown in FIG. 15.

Referring to FIG. 16, frequency dividing circuit 102A includes counters 111~113, NOR circuits NOR1~NOR3 and an AND circuit AND11.

Counters 111~113 are, for example, hexadecimal counters. Counter 111 outputs pulses from terminals Q0 to Q3 in accordance with the number of pulses of signal OSC. Pulses output from terminals Q0 to Q3 are input to NOR circuit NOR1. Counter 112 outputs pulses from terminals Q0 to Q3 in accordance with the pulse output from terminal Q3 of counter 111. Pulses output from terminals Q0 to Q3 of counter 112 are input to NOR circuit NOR2. Counter 113 outputs pulses from terminals Q0 to Q3 in accordance with the pulse output from terminal Q3 of counter 112. Pulses output from terminals Q0 to Q3 are input to NOR circuit NOR3.

An output of NOR circuit NOR2 and the signal SET are input to OR circuit OR21. An output of NOR circuit NOR2 and the signal SET are input to OR circuit OR21.

AND circuit AND11 receives an output of NOR circuit NOR1 and outputs of OR circuits OR21 and OR22, and outputs a signal SIG. When the signal SET is at the L level, one pulse is output as signal SIG every time the number of pulses of signal OSC attains to 4096. On the other hand, when the signal SET is at the H level, the signal SIG is output every time the number of pulses of signal OSC attains to 16. Specifically, when the signal SET is input (when the signal SET is at the H level), the first period T1 is made shorter.

The counters are not limited to hexadecimal counters, and they may be decimal counters. Further, the number of counters is not limited to three, and an appropriate number may be determined as needed.

As described above, according to the fourth embodiment, the length of the first period can be made shorter in accordance with a set signal input to the control circuit and, therefore, productivity of magnetic sensor circuits can be improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A magnetic sensor circuit, comprising:

a magnetoelectric converting element configured to generate an output voltage across a first terminal pair or a second terminal pair in accordance with applied magnetism;

a switch selecting circuit having a first switch status in which a power supply voltage is applied to said first terminal pair and an output voltage generated at said second terminal pair is output across a first output end and a second output end, and a second switch status in which the power supply voltage is applied to said second terminal pair and an output voltage generated at said first terminal pair is output across said first output end and said second output end;

an amplifying unit configured to output to a first amplification output end a first amplified voltage obtained by amplifying the voltage of said first output end input to a first amplification input end, and configured to output to a second amplification output end a second amplified voltage obtained by amplifying the voltage of said second output end input to a second amplification end;

a comparing unit configured to compare a first comparison voltage input to a first comparison input end with a second comparison voltage input to a second comparison input end and configured to generate a comparison output when said first comparison voltage is different from said second comparison voltage;

a first capacitor provided between said first amplification output end and said first comparison input end;

a second capacitor provided between said second amplification output end and said second comparison input end;

a first switch circuit for applying a first reference voltage to said first comparison input end; and a second switch circuit for applying a second reference voltage to said second comparison input end.

2. The magnetic sensor circuit according to claim 1, wherein said first reference voltage is applied to said first comparison input end in said first switch status; and said second reference voltage is applied to said second comparison input end in said first switch status.

3. The magnetic sensor circuit according to claim 1, wherein said second reference voltage is different from said first reference voltage.

4. The magnetic sensor circuit according to claim 1, wherein said amplifying unit includes:

a first operating amplifier configured to receive a voltage of said first output end at a non-inverting end and outputting said first amplified output from an output end, a first feedback resistor provided between said output end and an inverting input end of said first operating amplifier, a second operating amplifier configured to receive a voltage of said second output end at a non-inverting input end and outputting said second amplified output from an output end, a second feedback resistor provided between said output end and an inverting input end of said second operating amplifier, and a third feedback resistor provided between the inverting input end of said first operating amplifier and the inverting input end of said second operating amplifier.

5. The magnetic sensor circuit according to claim 1, further comprising:

a latch circuit configured to latch the comparison output from said comparing unit in response to a clock signal and configured to output a latch output; wherein said clock signal is generated at a timing of said second switch status.

6. The magnetic sensor circuit according to claim 5, further comprising:

a reference voltage switch circuit configured to convert a voltage applied to said first comparison input end from said first reference voltage either to a first modified reference voltage different from said first reference voltage or to said second reference voltage, in response to said latch output.

7. The magnetic sensor circuit according to claim 1, wherein at least one of said amplifying unit and said comparing unit is configured to operate intermittently as the power supply voltage is applied at every first interval for a prescribed time period.

8. The magnetic sensor circuit according to claim 7, wherein a period of said first switch status is provided in a former half and a period of said second switch status is provided in a latter half, of said prescribed time period.

9. The magnetic sensor circuit according to claim 8, further comprising a latch circuit configured to latch the comparison output from said comparing unit in response to a clock signal and outputting a latch output; wherein said clock signal is generated at a timing of said second switch status.

10. The magnetic sensor circuit according to claim 9, further comprising:

a reference voltage switch circuit configured to convert a voltage applied to said first comparison input end from said first reference voltage either to a first modified reference voltage different from said first reference voltage or to said second reference voltage, in response to said latch output.

11. The magnetic sensor circuit according to claim 1, further comprising a first resistor connected between a first reference voltage end outputting said first reference voltage and a second reference voltage end outputting said second reference voltage;

a second resistor having one end connected to said first reference voltage end and the other end connectable to a ground potential; and a third resistor having one end connected to said second reference voltage end and the other end connectable to said power supply voltage; wherein resistance value of said first resistor is smaller than a sum of resistance value of said second resistor and resistance value of said third resistor;

an amount of change with temperature of the resistance value of said first resistor is smaller than an amount of change with temperature of electric resistance value of said magnetoelectric converting element; and temperature characteristic of the resistance value of said second resistor and temperature characteristic of the resistance value of said third resistor are both the same as temperature characteristic of the electric resistance value of said magnetoelectric converting element.

12. The magnetic sensor circuit according to claim 11, wherein said magnetoelectric converting element, said second resistor and said third resistor are elements formed of a material of the same type in one same semiconductor substrate.

13. The magnetic sensor circuit according to claim 1, further comprising:

a control circuit configured to cause at least one of said amplifying unit and said comparing unit to operate intermittently by controlling the power supply voltage to be supplied at every first interval for a prescribed time period; wherein said control circuit configured to set said switch selecting circuit to said first switch status, said second switch status, said second switch status and said first status, respectively, in first to fourth periods included in said prescribed time period, and configured to control said first switch circuit so that said first reference voltage is applied to said first comparison input end, and configured to control said second switch circuit so that said second reference voltage is applied to said second comparison input end, in said first and third periods.

14. The magnetic sensor circuit according to claim 13, further comprising:

a first latch circuit configured to latch the comparison output from said comparing unit in response to a first clock signal and configured to output a first latch output;

an OR circuit configured to receive said comparison output and said first latch output; and a second latch circuit configured to latch an output from said OR circuit in response to a second clock signal and configured to output a second latch output; wherein said control circuit configured to output said first clock signal in said second period, and configured to output said second clock signal in said fourth period.

15. The magnetic sensor circuit according to claim 14, further comprising:

a reference voltage switch circuit configured to convert a voltage applied to said first comparison input end from said first reference voltage either to a first modified reference voltage different from said first reference voltage or to said second reference voltage, in response to said second latch output.

16. The magnetic sensor circuit according to claim 13, wherein said control circuit configured to set said switch selecting circuit such that said second switch status starts after a prescribed time period from the end of said first switch status in said second period, and configured to set said switch selecting circuit such that said first switch status starts after said prescribed time period from the end of said second switch status in said fourth period.

17. The magnetic sensor circuit according to claim 13, wherein said control circuit configured to change length of said first period based on an input set signal.

18. A portable terminal, comprising:

a battery power source; and a magnetic sensor circuit to which a power supply voltage of said battery power source is supplied as an operational voltage; wherein said magnetic sensor circuit includes:

a magnetoelectric converting element configured to generate an output voltage across a first terminal pair or a second terminal pair in accordance with applied magnetism, a switch selecting circuit having a first switch status in which a power supply voltage is applied to said first terminal pair and an output voltage generated at said second terminal pair is output across a first output end and a second output end, and a second switch status in which the power supply voltage is applied to said second terminal pair and an output voltage generated at said first terminal pair is output across said first output end and said second output end, an amplifying unit configured to output to a first amplification output end a first amplified voltage obtained by amplifying the voltage of said first output end input to a first amplification input end, and configured to output to a second amplification output end a second amplified voltage obtained by amplifying the voltage of said second output end input to a second amplification end, a comparing unit configured to compare a first comparison voltage input to a first comparison input end with a second comparison voltage input to a second comparison input end and configured to generate a comparison output when said first comparison voltage is different from said second comparison voltage, a first capacitor provided between said first amplification output end and said first comparison input end, a second capacitor provided between said second amplification output end and said second comparison input end, a first switch circuit for applying a first reference voltage to said first comparison input end, and a second switch circuit for applying a second reference voltage to said second comparison input end.

* * * * *